United States Patent [19]
Yamada et al.

[11] Patent Number: 5,043,298
[45] Date of Patent: Aug. 27, 1991

[54] PROCESS FOR MANUFACTURING A DRAM CELL

[75] Inventors: Takashi Yamada, Kawasaki; Fumio Horiguchi, Tokyo; Satoshi Inoue; Akihiro Nitayama, both of Kawasaki; Kazumasa Sunouchi, Yokohama, all of Japan

[73] Assignee: Kabushiki Kaisha Toshiba, Kawasaki, Japan

[21] Appl. No.: 619,666

[22] Filed: Nov. 28, 1990

Related U.S. Application Data

[63] Continuation of Ser. No. 489,803, Mar. 8, 1990, abandoned.

[30] Foreign Application Priority Data

Mar. 9, 1989 [JP] Japan .................... 1-56971
Feb. 27, 1990 [JP] Japan .................... 2-46714

[51] Int. Cl.$^5$ ........................... H01L 21/70
[52] U.S. Cl. ........................ 437/52; 437/47; 437/48; 437/49; 437/60; 437/191; 437/919; 437/981
[58] Field of Search ............ 437/40, 41, 47, 48, 437/49, 60, 191, 200, 228, 233, 235, 919, 981; 357/23.6, 51

[56] References Cited

U.S. PATENT DOCUMENTS

| | | | |
|---|---|---|---|
| 4,054,989 | 10/1977 | Ho et al. | 437/41 |
| 4,069,067 | 1/1978 | Ichinohe | 437/41 |
| 4,403,392 | 9/1983 | Oshima et al. | 437/186 |
| 4,455,737 | 6/1984 | Godejahn | 437/41 |
| 4,686,000 | 8/1987 | Heath | 437/235 |
| 4,694,565 | 9/1987 | Custode | 437/41 |
| 4,697,328 | 10/1987 | Custode | 437/41 |
| 4,855,801 | 8/1989 | Kuesters | 357/23.6 |

FOREIGN PATENT DOCUMENTS

| | | | |
|---|---|---|---|
| 0014580 | 2/1978 | Japan | 437/41 |
| 0181154 | 8/1986 | Japan | 437/41 |
| 2021861 | 12/1979 | United Kingdom | 437/41 |
| 2062959 | 5/1981 | United Kingdom | |

OTHER PUBLICATIONS

Extended Abstracts, (The 35th Spring Meeting, 1988), The Japanese Society of Applied Physics and Related Societies, M. Kubota et al., 28p-V-4, 1988.

*Primary Examiner*—Brian E. Hearn
*Assistant Examiner*—Tom Thomas
*Attorney, Agent, or Firm*—Finnegan, Henderson, Farabow, Garrett and Dunner

[57] ABSTRACT

When a semiconductor device having a multi-layered contact is fabaricated, the gate electrode is covered with a thick insulator film. A polycrystalline silicon film is formed in a state in which at least the gate electrode in the contact forming area is covered with a first oxidization-proof insulator film. An inter-layer insulator film is then formed in a state in which at least part of the polycrystalline silicon film is covered with a second oxidization-proof insulator film. A first contact hole is formed using the polycrystalline silicon film as an etching stopper, and the polycrystalline silicon film is then oxidized. Furthermore, a second contact hole is formed in the inter-layer insulator film on the upper surface of the second oxidization-proof insulator film using as the etching stopper the polycrystalline silicon film underlying the second oxidization-proof insulator film. Since the polycrystalline silicon film is formed under the inter-layer insulator film in the second contact forming area so as to cover the gate electrode, it acts as a stopper when the second contact is formed to thereby prevent a short circuit with the gate electrode even if there is no distance between the gate electrode and the second contact.

14 Claims, 28 Drawing Sheets

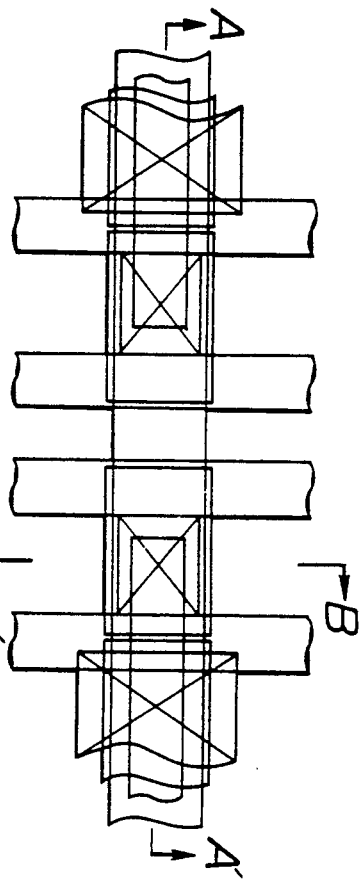
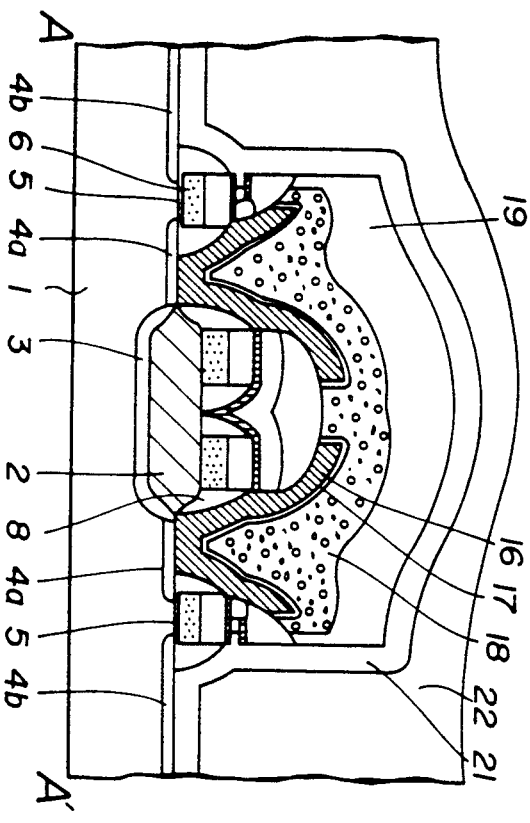
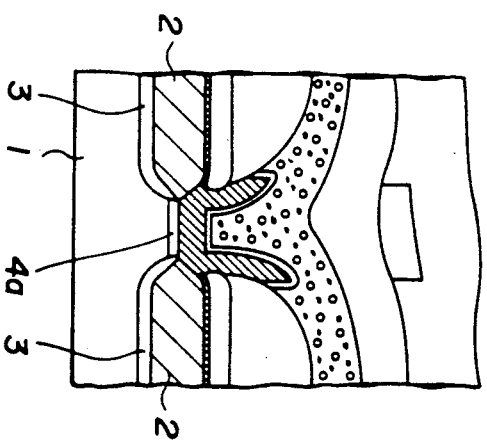

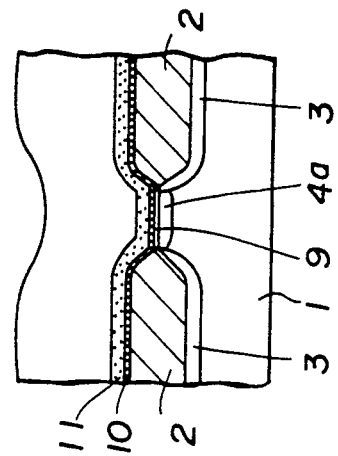
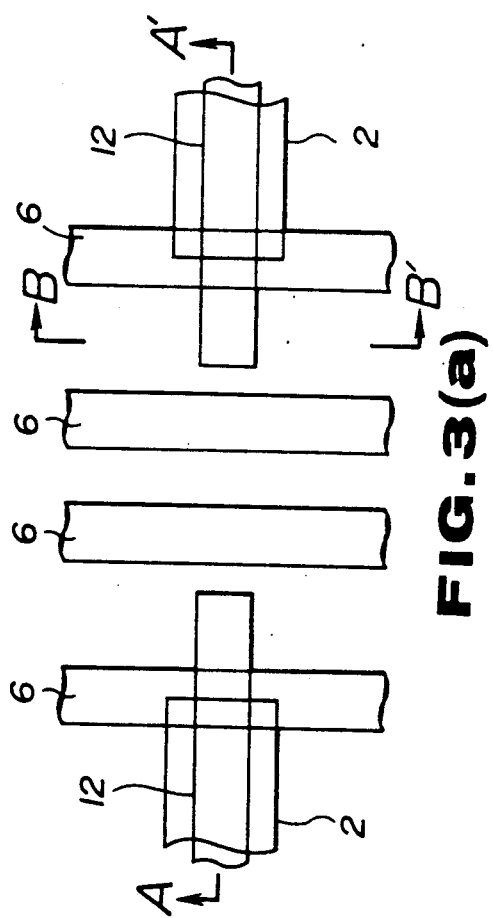
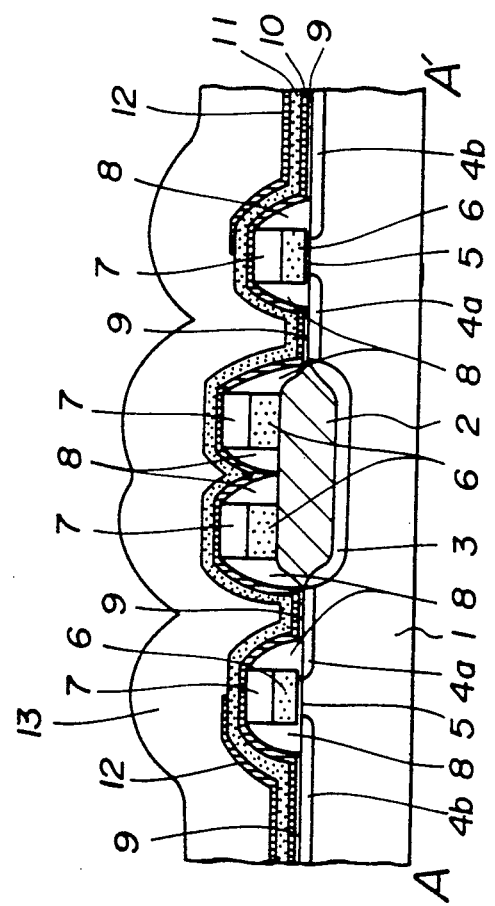
FIG.3(a)
FIG.3(b)
FIG.3(c)

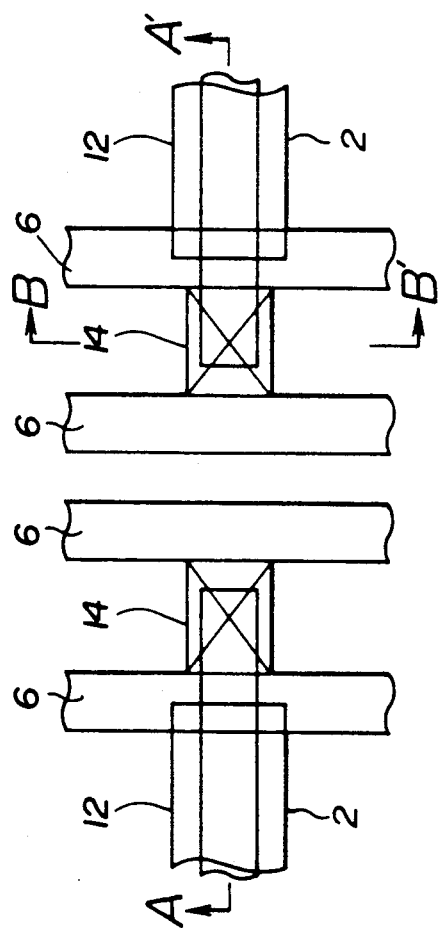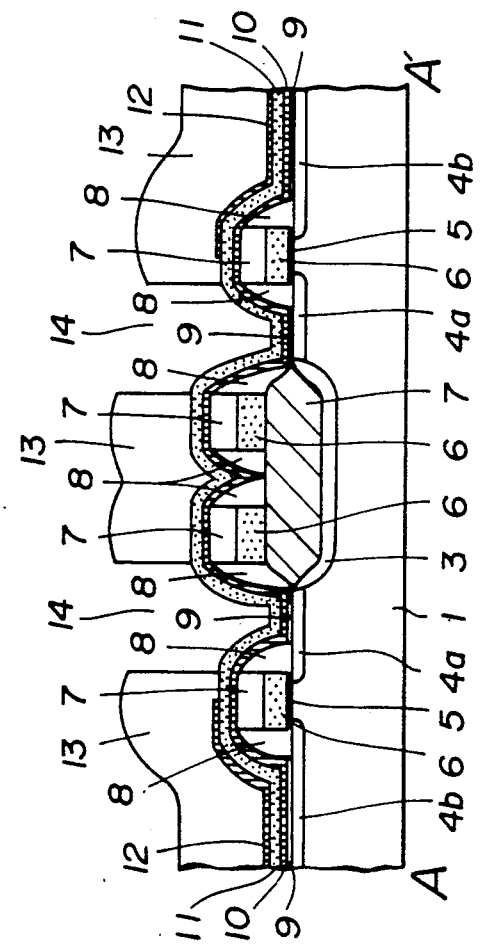

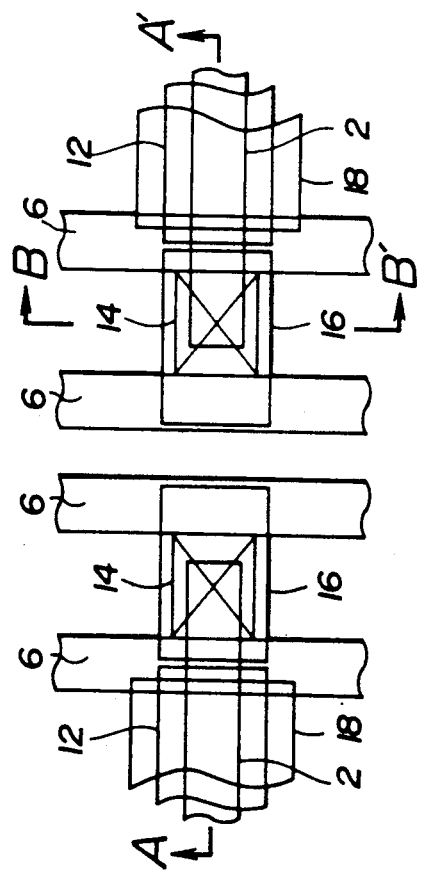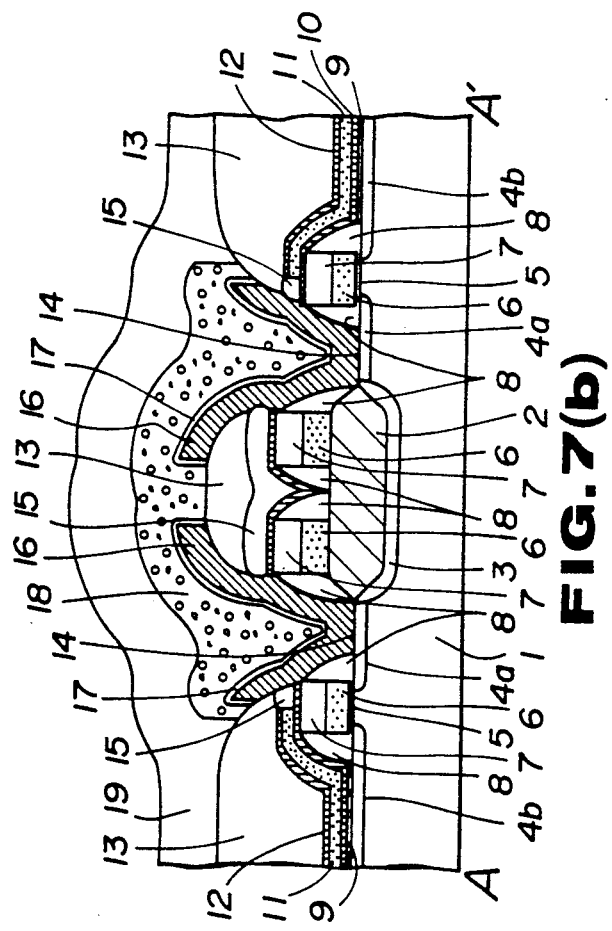
FIG. 7(a)
FIG. 7(b)
FIG. 7(c)

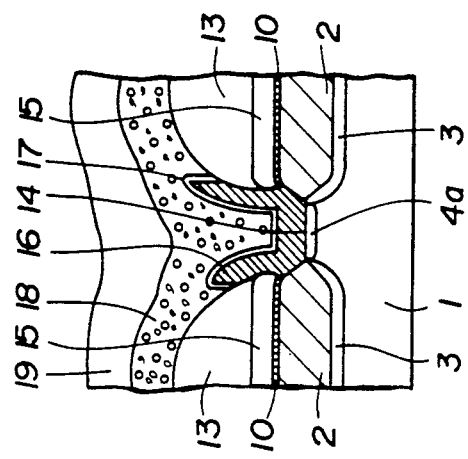
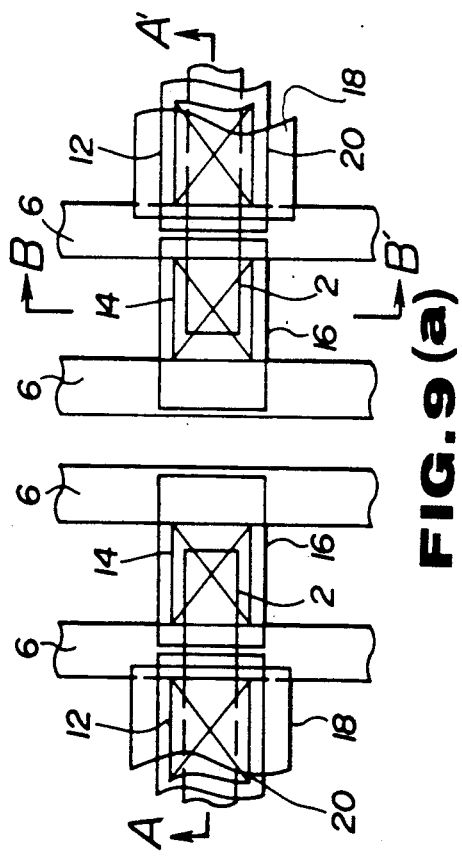
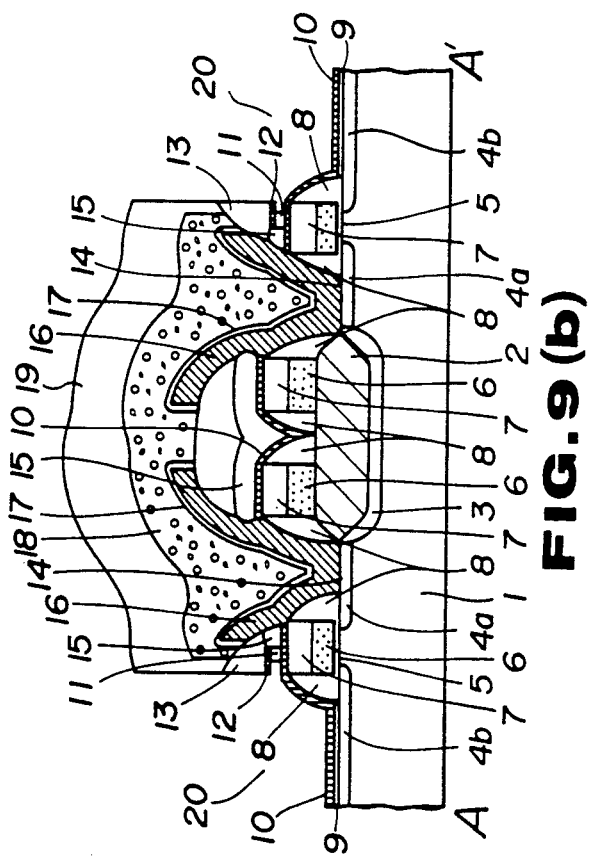

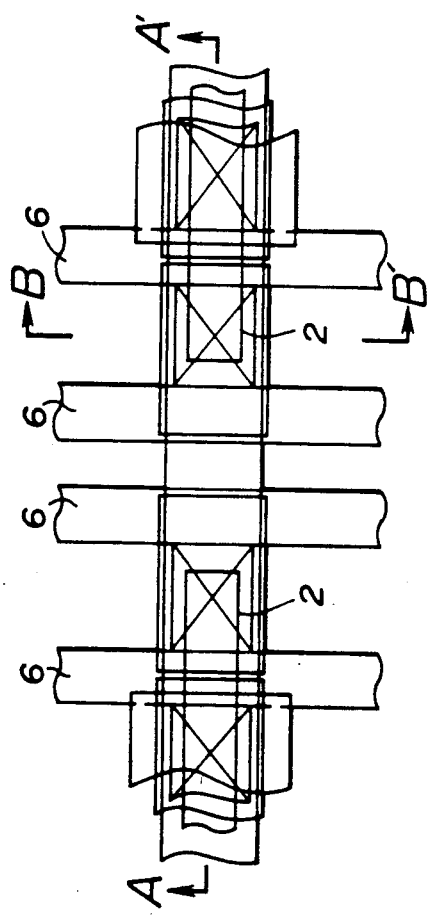
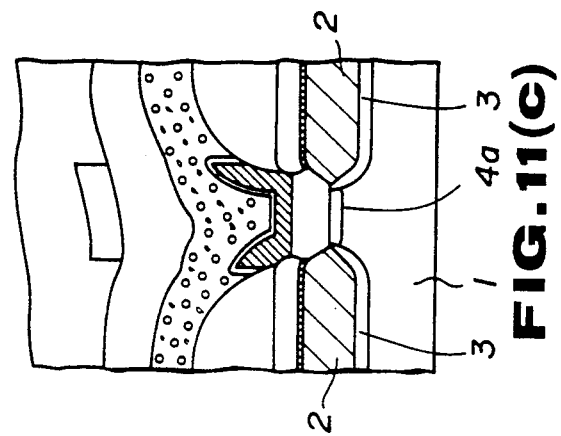
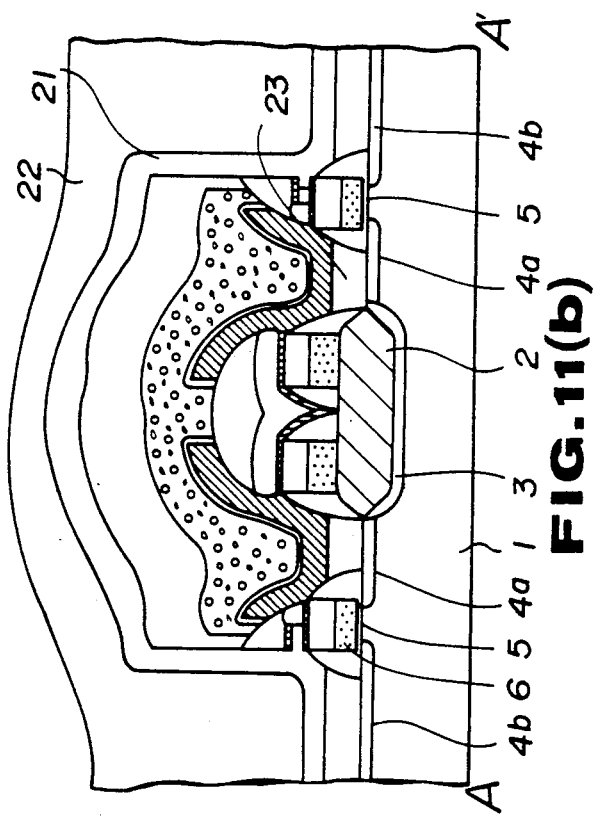
FIG.11(a)
FIG.11(b)
FIG.11(c)

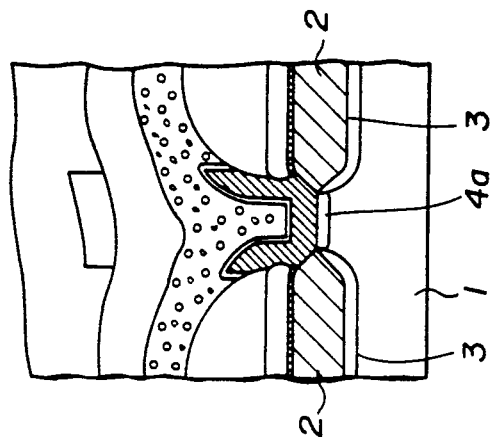
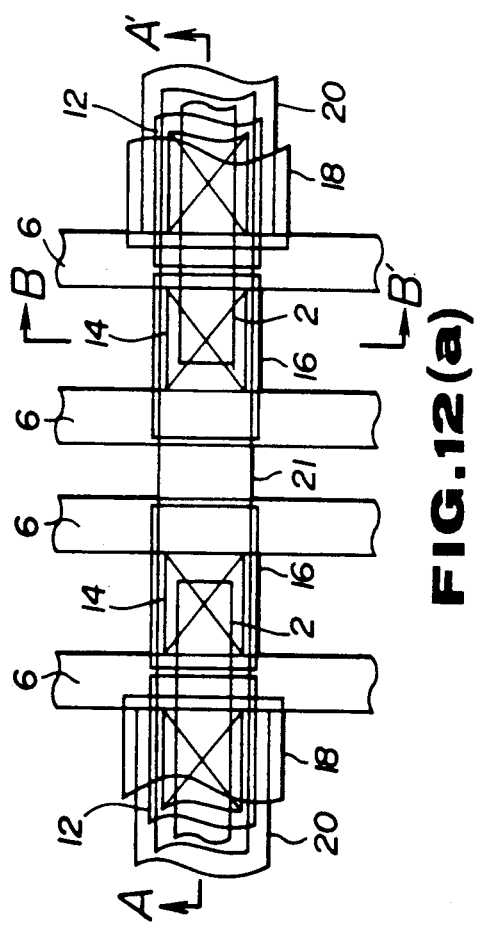
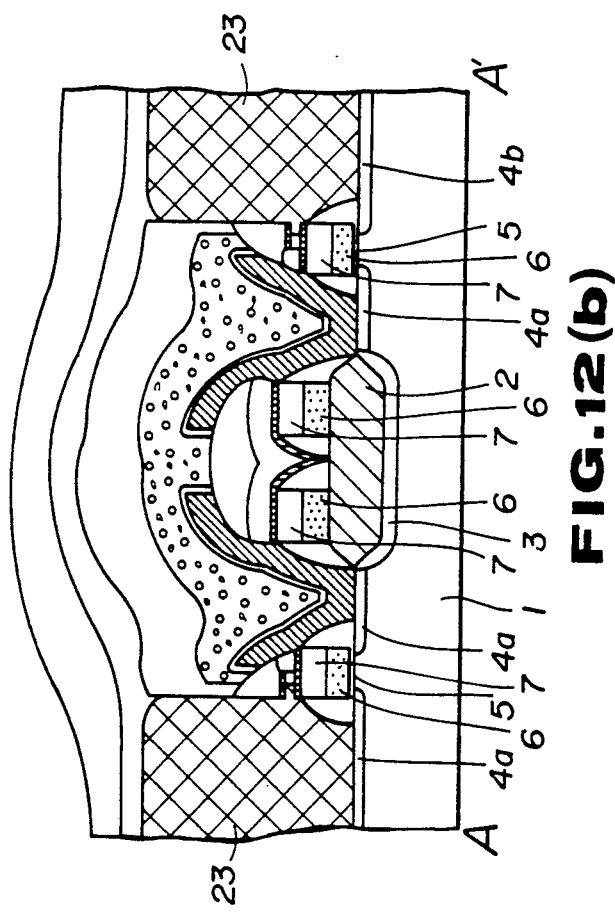

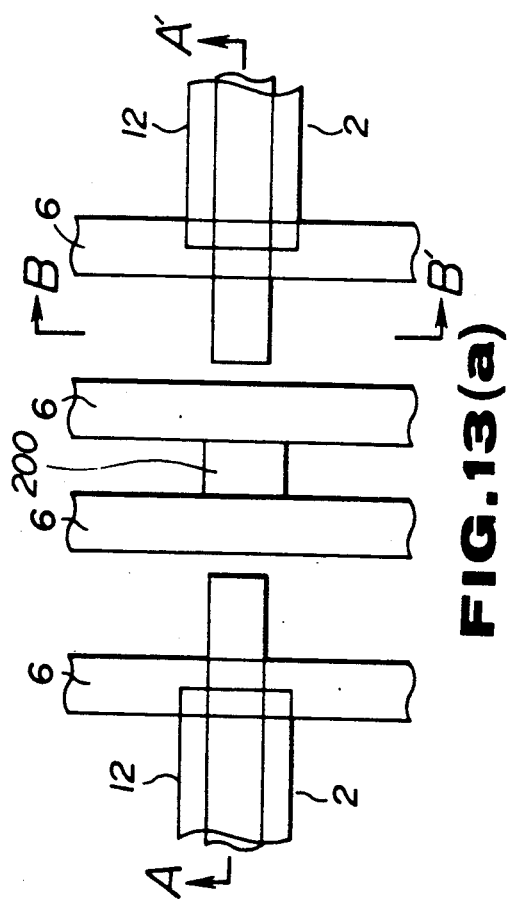
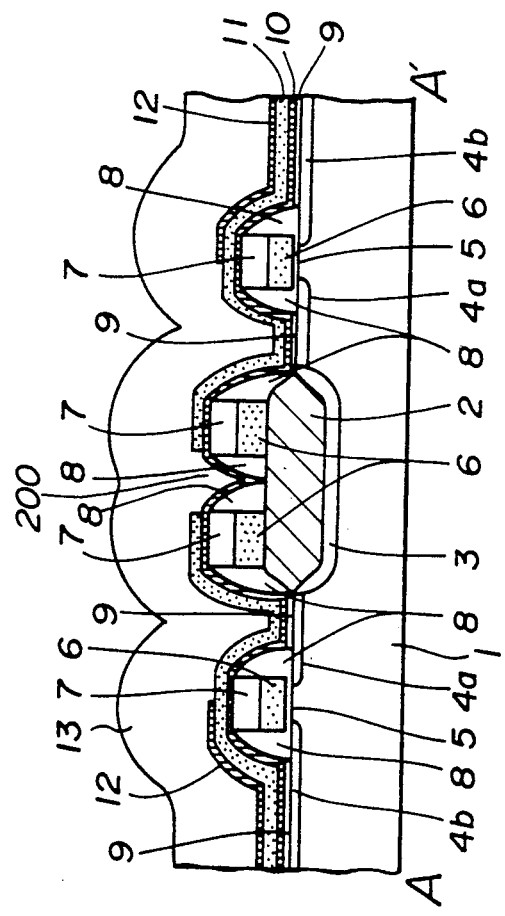
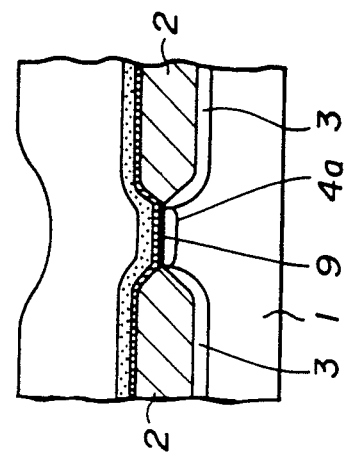
FIG.13(a)
FIG.13(b)
FIG.13(c)

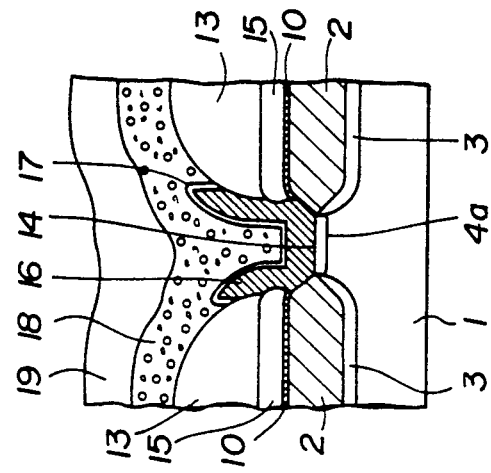
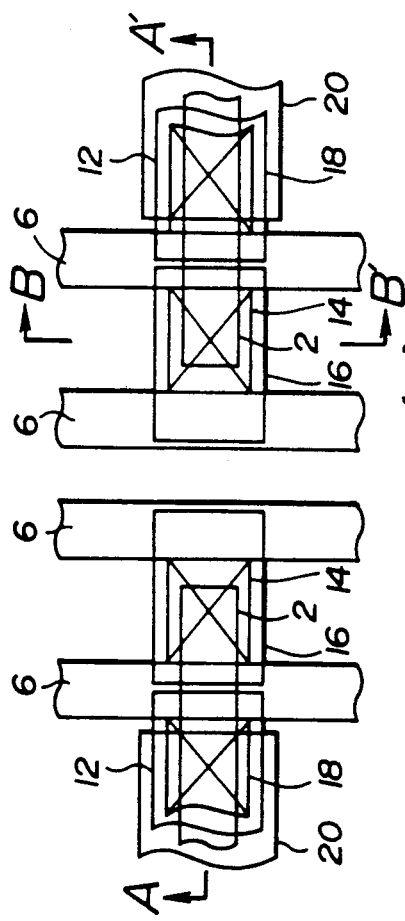
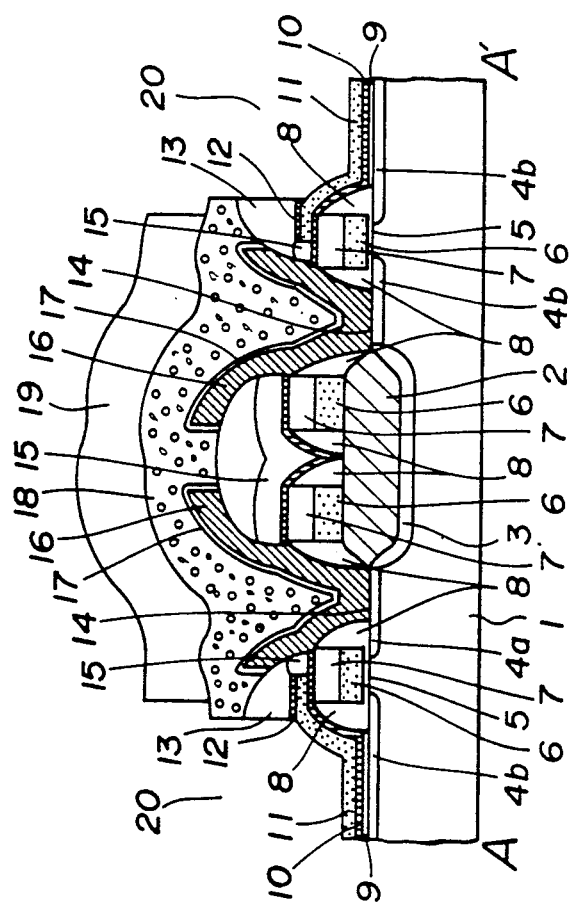

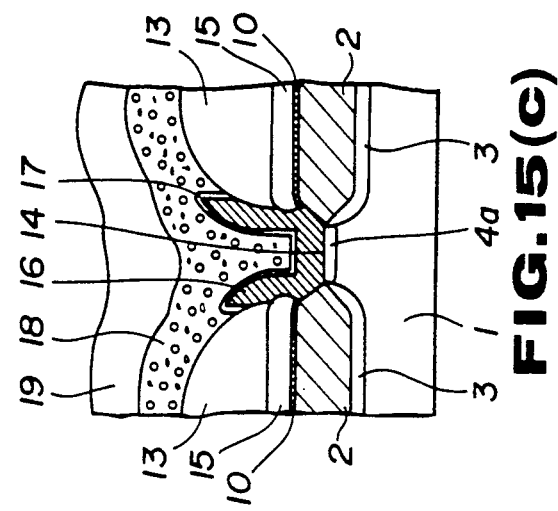
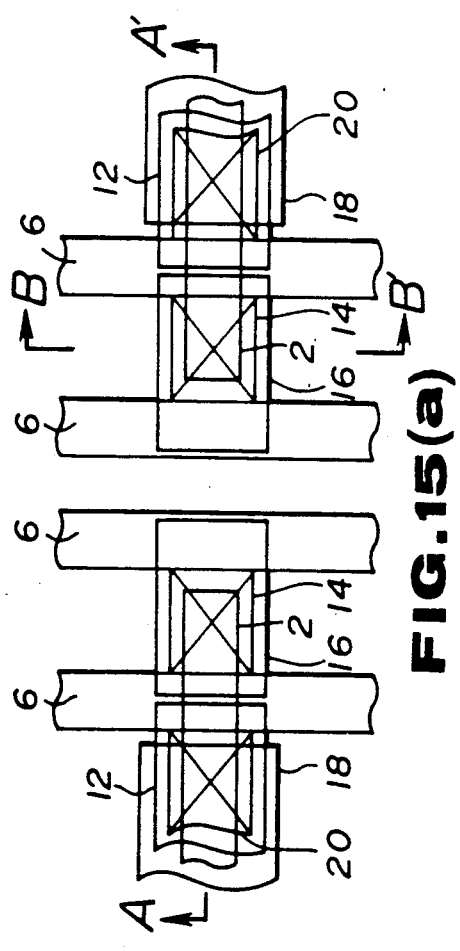
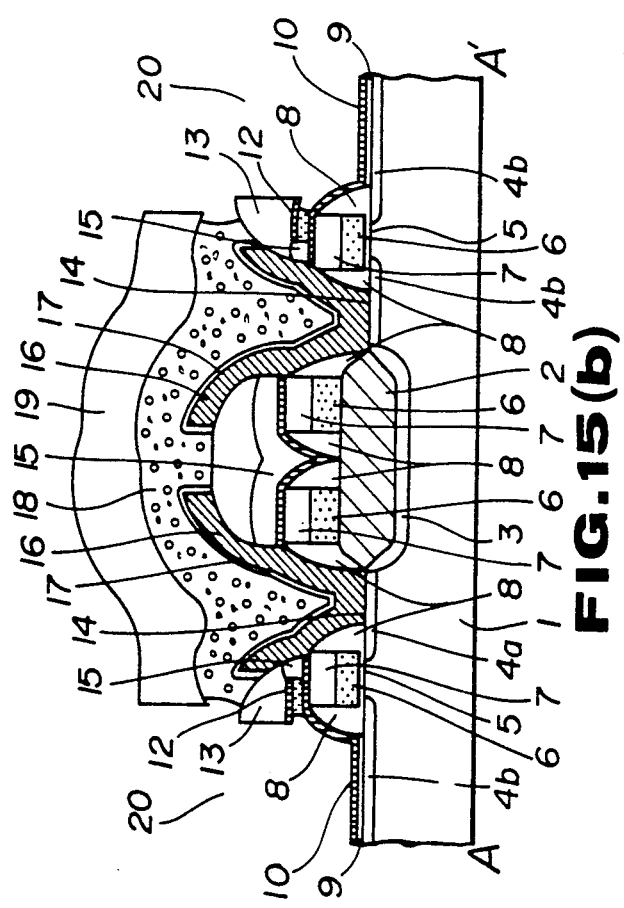

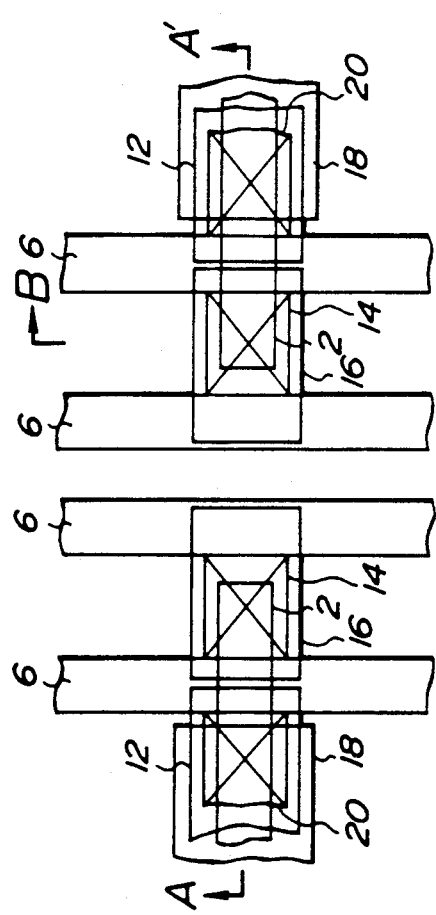
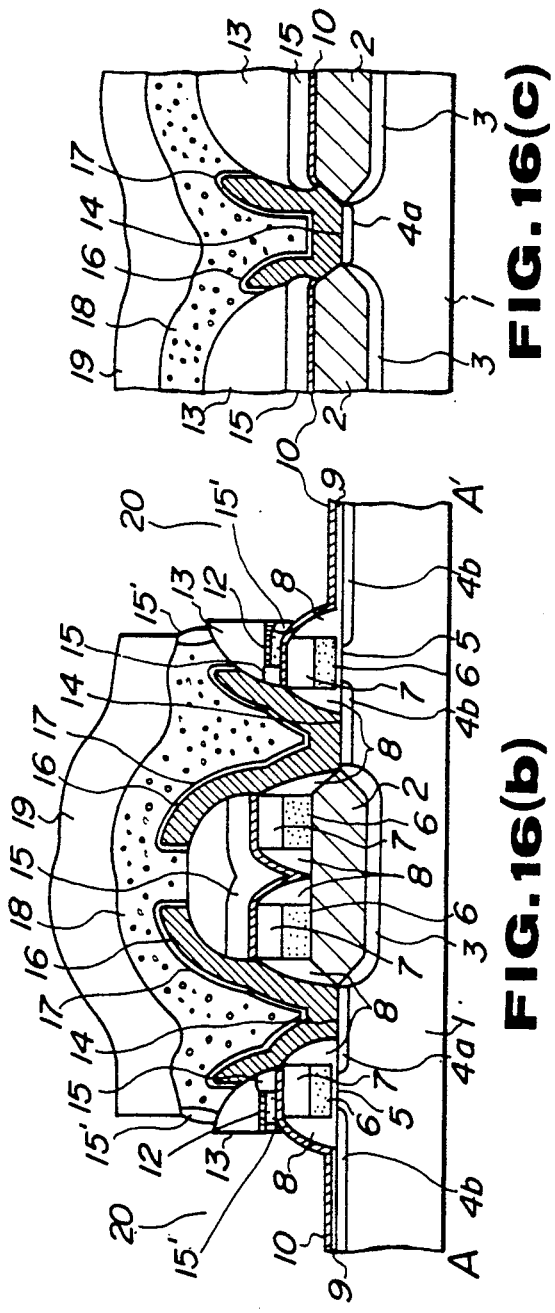

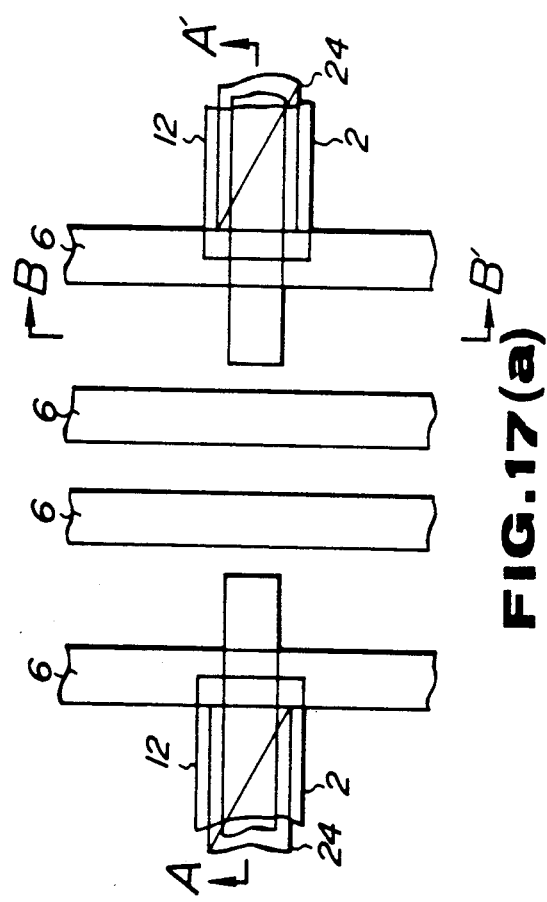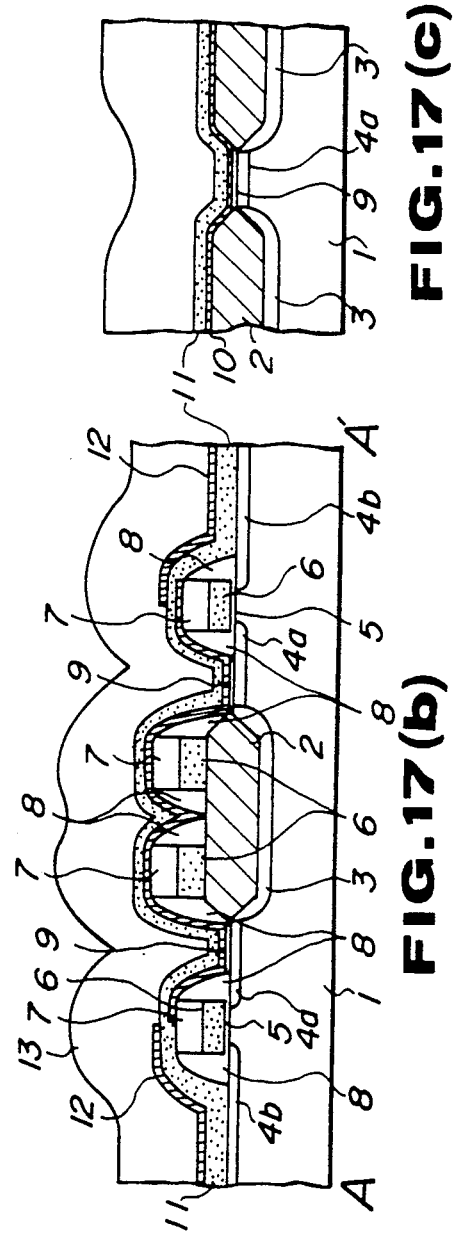
FIG.17(a)
FIG.17(b)
FIG.17(c)

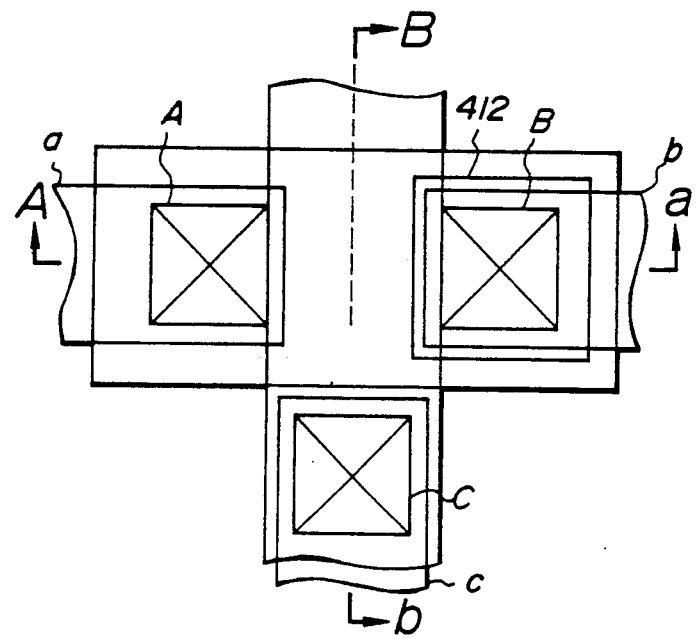
FIG.22(a)
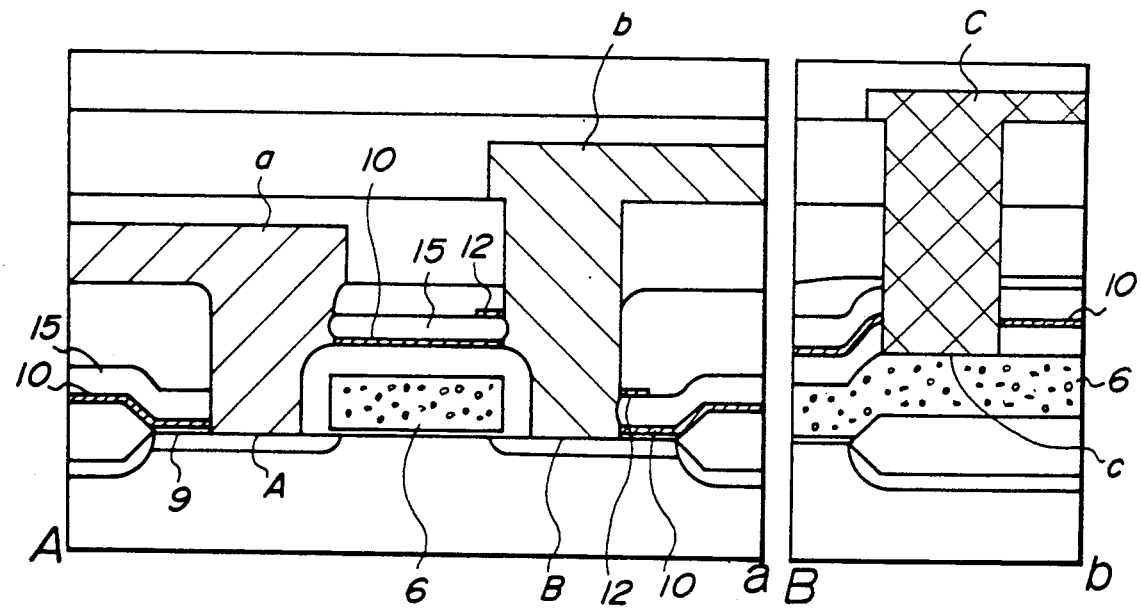
FIG.22(b)  FIG.22(c)

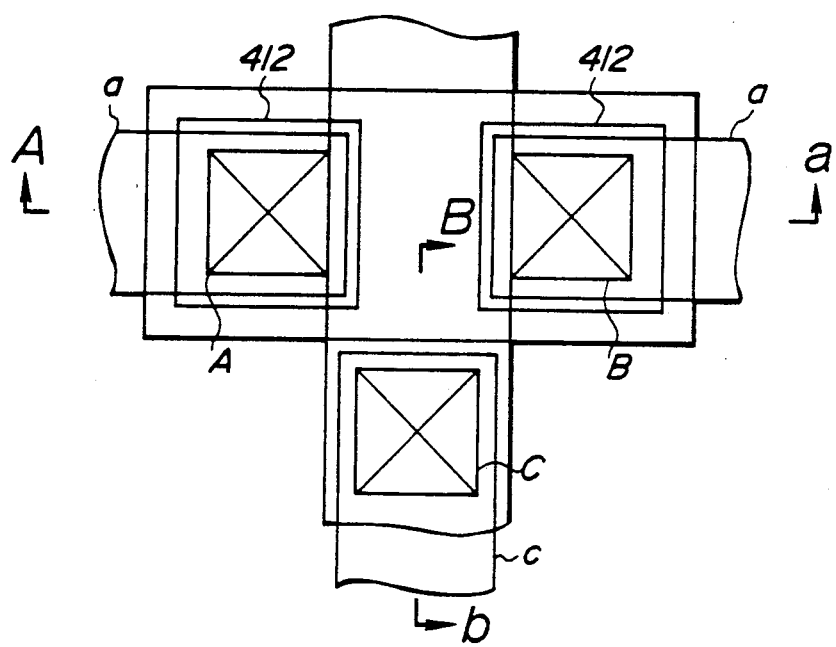
FIG.23(a)
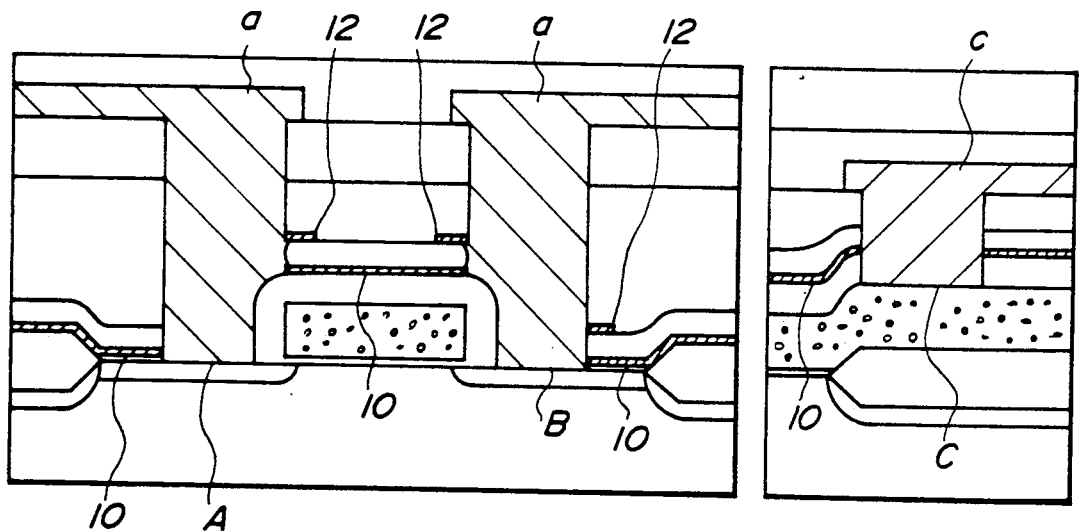
FIG.23(b)     FIG.23(c)

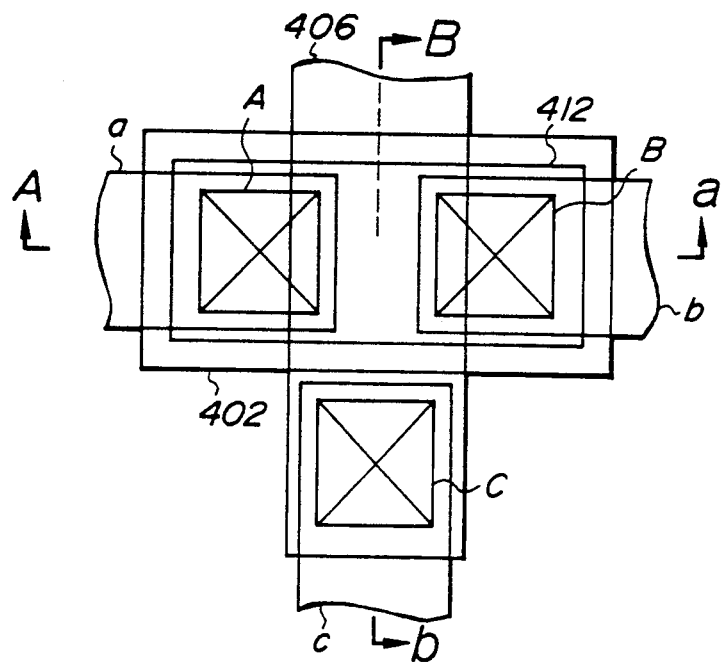
FIG.25(a)
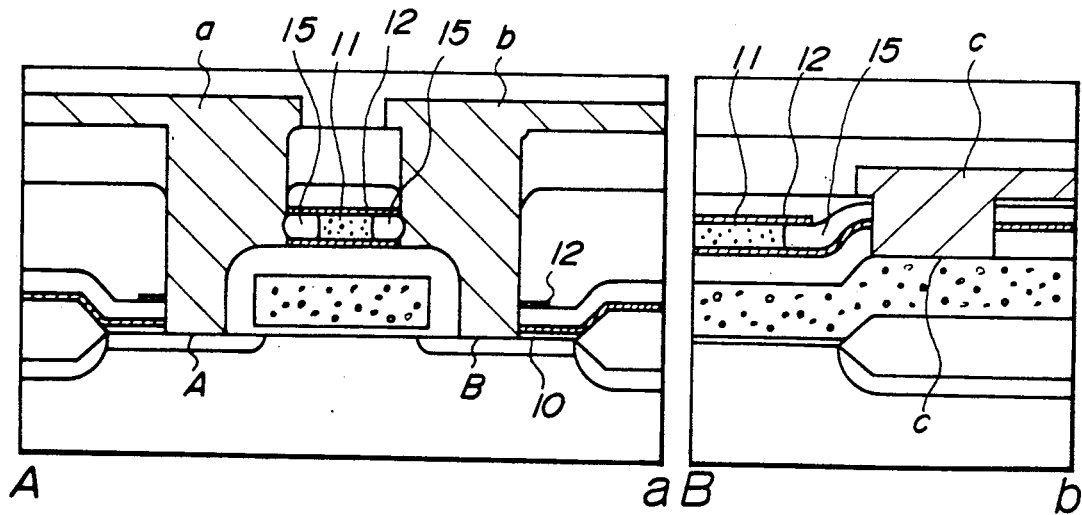
FIG.25(b)     FIG.25(c)

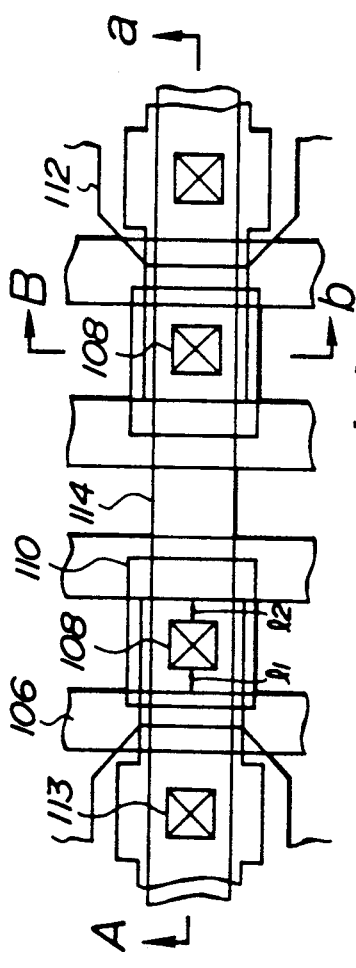
FIG.26(a) *(Prior Art)*
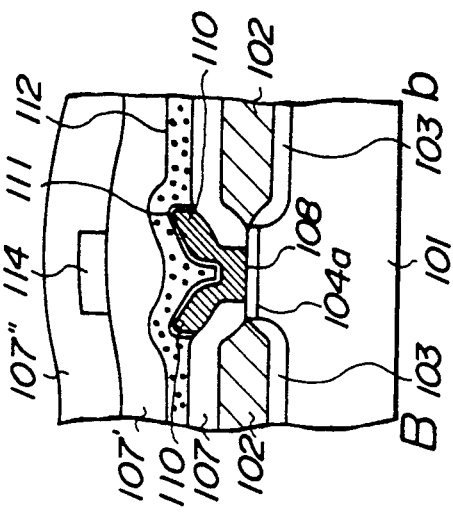
FIG.26(c) *(Prior Art)*
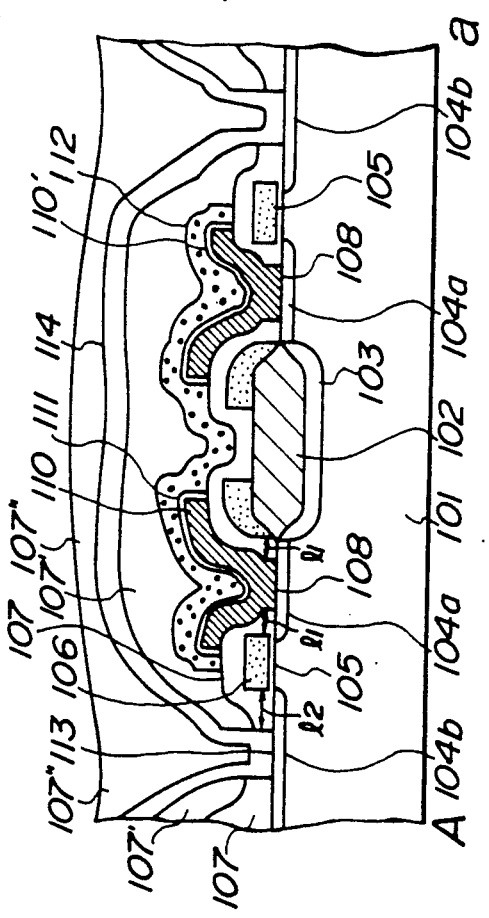
FIG.26(b) *(Prior Art)*

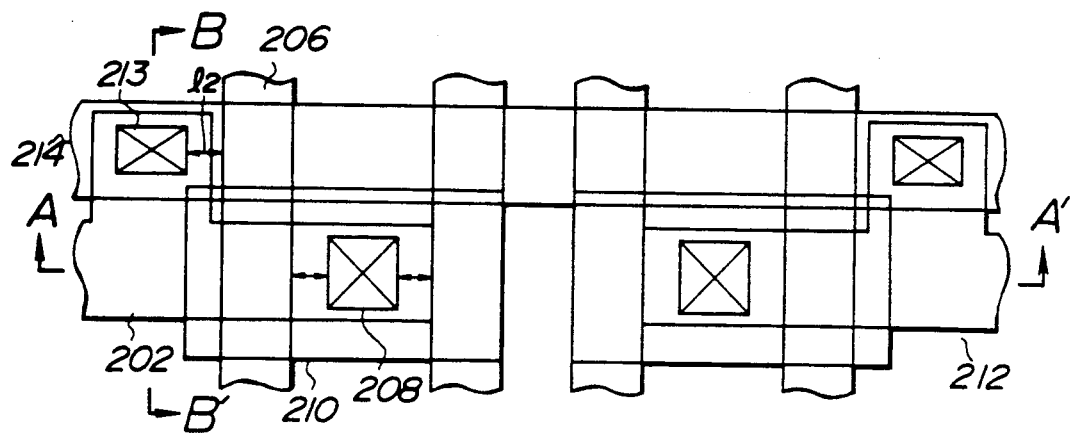
FIG. 27 (a) *(Prior Art)*
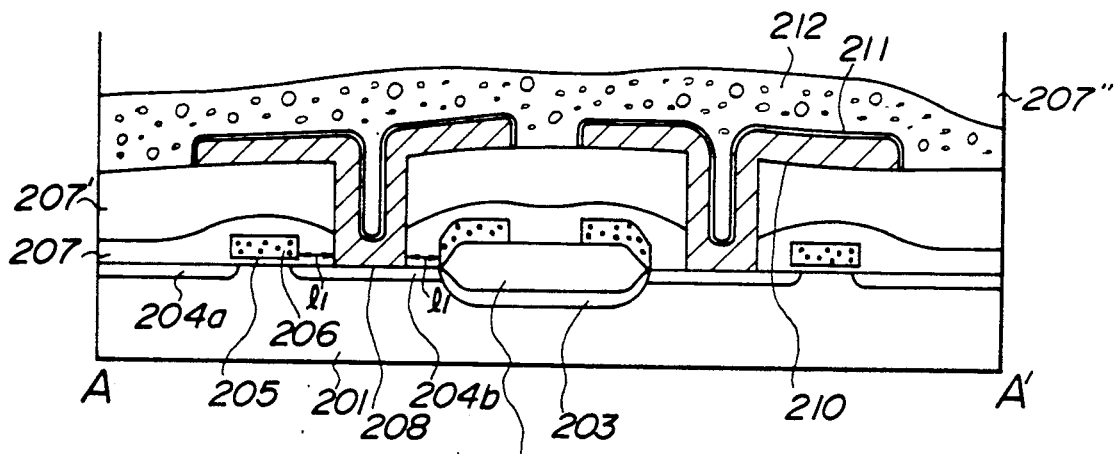
FIG. 27 (b) *(Prior Art)*
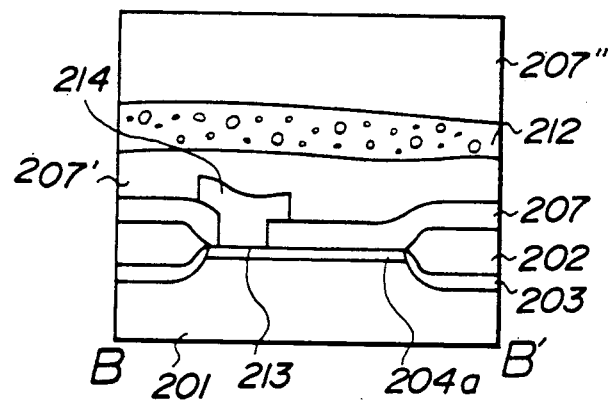
FIG. 27 (c) *(Prior Art)*

PROCESS FOR MANUFACTURING A DRAM CELL

This application is a continuation of application Ser. No. 07/489,803, filed Mar. 8, 1990, now abandoned.

BACKGROUND OF THE INVENTION

1. Field of the Invention

The present invention relates to processes for manufacturing semiconductor devices, and more particularly to a process for forming a contact in a MOSFET, a DRAM, etc.

2. Prior Art

Recently, increases in the integration density and capacity of so called MOS type DRAMs have been speeded up by the advancement of semiconductor techniques and more particularly by the advancement of the fine-working techniques.

By such increase in the integration density, the area of capacitors which store information (electric charges) decreases, and as a result, for example, a soft error arises in which the contents of a memory are read erroneously or destroyed by α-rays, etc.

Many methods are proposed which include the steps of forming storage nodes on a silicon substrate and increasing the area occupied by the capacitors, their capacitance and hence a quantity of electric charges stored in the capacitors to thereby increase the integration of such DRAMs.

To this end, a memory cell structure called a layered type memory cell is proposed in which a MOS capacitor is layered on a memory cell area, one electrode of the capacitor and one electrode of a switching transistor formed on the semiconductor substrate are rendered conductive thereacross to thereby increase the static capacitance of the MOS capacitor substantially.

As shown in FIGS. 26(a)-26(c), the layered-type memory cell includes a switching MOSFET as a transistor constituted by source and drain regions 104a and 104b of n-type diffusion layer, and a gate electrode 106 provided via a gate insulating film 105 between the source and drain electrodes 104a and 104b in one of two areas into which a p-type silicon substrate 101 is divided by an element separating insulator film 102. A capacitor is provided which includes a first capacitor electrode 110 and a second capacitor electrode 112 and an insulator film 111 held therebetween, the first capacitor electrode 110 being formed so as to contact the source region 104a of the MOSFET and so as to overlie the gate electrodes (or word lines) of the MOSFET and of a MOSFET of an adjacent memory cell via the insulator film 2.

The layered-type memory cell is formed as follows. In the cell, the MOSFET is formed as the switching transistor by forming the source and drain regions 104a and 104b of an n-type diffusion layer and the gate electrode 106 via the gate insulating film 105 between the source and drain regions 104a and 104b in the p-type silicon substrate 101.

A silicon oxide film is formed as an insulator film 107 on the whole substrate surface, and a storage node contact 108 is formed contacting the drain region 104b to form a pattern of the first capacitor electrode 110 of densely doped polycrystalline silicon layer.

A capacitor insulator film 111, for example, of silicon oxide, and a polycrystalline silicon layer are then deposited sequentially on the first capacitor electrode 110.

Thereafter, ions, for example, of phosphorus, are implanted into the polycrystalline silicon layer, which is then subjected to heat treatment at a temperature of about 900° C. for 120 minutes to thereby form a polycrystalline silicon layer doped densely so as to have a desired conductivity.

The polycrystalline silicon layer is patterned to form a capacitor including the first and second capacitor electrodes 110 and 112 with the insulator film 111 therebetween.

Finally, an inter-layer insulator film 107' is formed, a bit line contact 113 is formed and a bit line is formed, for example, of molybdenum polycide. An inter-layer insulator film 107" is then formed on the film 107' to thereby provide the memory cell including the MOSFET and capacitor.

By such structure, the storage node electrode is expanded to over the device separating region and a step in the storage node electrode can be used, so that the capacity of the capacitor is increased to several-tens times that of a planar structure.

In order to provide a layered-type memory cell having an increased capacitor pattern area, a method is proposed which includes the steps of forming a switching transistor, a bit line and a capacitor in this order, as shown in FIGS. 27(a)-(c).

The layered-type memory cell is formed as follows. As in the memory cell shown in FIG. 26, the MOSFET is formed as the switching transistor by forming the source and drain regions 204a and 204b of an n-type diffusion layer and the gate electrode 206 via the gate insulating film 205 between the source and drain regions 204a and 204b in the p-type silicon substrate 201.

A silicon oxide film is formed as an insulator film 207 on the whole substrate surface, and a bit line contact 213 is formed contacting the source region 204a, a pattern of a bit line 214 is formed, for example, of molybdenum polycide.

An inter-layer insulator film 207' is then formed and a storage node contact 208 is formed to contact the drain region 204b to thereby form a pattern of the first capacitor electrode 210 of a densely doped polycrystalline silicon layer.

A capacitor insulator film 211, for example, of silicon oxide, and a polycrystalline silicon layer are then deposited sequentially on the first capacitor electrode 210.

Thereafter, ions, for example, of phosphorus, are implanted into the polycrystalline silicon layer, which is then subjected to heat treatment at a temperature of about 900° C. for 120 minutes to thereby form a polycrystalline silicon layer doped densely so as to have a desired conductivity.

The polycrystalline silicon layer is patterned to form a capacitor including the first and second capacitor electrodes 210 and 212 with the insulator film 211 therebetween. The second capacitor electrode 210 is formed on the entire surface of the substrate.

Finally, an inter-layer insulator film 207" is then formed on the film 207' to thereby provide the memory cell including the MOSFET and capacitor.

Since in the particular arrangement the storage node electrode is expanded in the direction of extension of the bit line contact, the capacitor capacity is increased compared to the memory cells shown in FIG. 26.

However, even in the DRAM of such layered-type memory cell structure, the distance between the storage node contact and the gate electrode (shown by 11 in FIG. 26(a) and FIG. 27(a)) and the distance between the bit line contact and the gate electrode (12 in FIG. 26(a) and FIG. 27(a)) must be decreased as finer devices are manufactured as a result of an increase in the integration density. Therefore, a short circuit is likely to occur between the storage node and the gate electrode and between the bit line and gate electrode to thereby reduce reliability.

The problem of a reduced distance between the contact and gate electrode applies to the pattern of the memory cells as well as to any of all the pattern of peripheral circuits.

FIG. 28 shows an illustrative transistor in a peripheral circuit. As the fining of such a peripheral circuit advances, the distances 13, 14 between the gate electrode and adjacent contact to thereby raise a problem of short circuit.

It is therefore an object of the present invention to provide a miniaturized highly reliable memory cell structure which prevents a short circuit from occurring between the storage node and the gate electrode, between the bit line and the gate electrode or between a lead for each of contacts in peripheral circuits and the gate electrode in spite of reduction of an area which the memory cell occupies, and a process for manufacturing such memory cell structure.

SUMMARY OF THE INVENTION

In the present invention, the gate electrode is covered with a thick insulator film. A polycrystalline silicon film is formed in a state in which at least the gate electrode in the contact forming area is covered with a first oxidization-proof insulator film. An inter-layer insulator film is then formed in a state in which at least part of the polycrystalline silicon film is covered with a second oxidization-proof insulator film. A contact hole is formed using the polycrystalline silicon film as an etching stopper, and the polycrystalline silicon film is then oxidized. Furthermore, the inter-layer insulator film on the upper surface of the second oxidization-proof insulator film is patterned using the polycrystalline silicon film underlying the second oxidization-proof insulator film as the etching stopper.

According to this process, since the polycrystalline silicon film is formed under the inter-layer insulator film in the contact forming area so as to cover the gate electrode in the semiconductor device which includes a multi-layered contact, it acts as a stopper when the storage node contact is formed to thereby prevent a short circuit with the gate electrode even if there is no distance between the gate electrode and the node contact.

The stopper polycrystalline silicon is etched using a process for selectively etching the oxidization-proof insulator film, and the resulting half-finished product is then oxidized. Thus, the polycrystalline silicon film on the upper surface of which no second oxidization-proof insulator film is formed becomes an oxidized film, so that there is no probability of short circuit through the polycrystalline silicon film.

Since the second oxidization-proof insulator film is formed on the upper surface of the polycrystalline silicon film, the polycrystalline silicon remaining free from oxidization also acts as a stopper in the next contact forming process. For example, if the second oxidization-proof insulator film is formed so as to cover the gate electrode in the bit line contact forming area in a layered-type memory cell shown in FIG. 26, the underlying storage node contact can be formed using the polycrystalline silicon as the stopper and the bit line contact can then be formed quite similarly using the polycrystalline silicon as the stopper. Thus, even if there is no distance between the bit line contact and the gate, there is no danger of a short circuit.

As just described above, if the polycrystalline silicon film is covered with an oxidization-proof insulation film when required, it can be used as a stopper when the bit line contact is formed as well as when a contact is subsequently in a peripheral circuit, etc., to thereby provide a high reliability semiconductor device very easily.

If the first oxidization-proof insulator film in the contact forming area is removed before the formation of the polycrystalline silicon film after the formation of the first oxidization-proof insulator film, the polycrystalline silicon film may be doped by ion implantation when the contact is formed. If otherwise, the polycrystalline silicon film is rediffused from the source and drain areas, so that it need not be removed when the contact is formed to thereby help the reduction of a step on the surface.

BRIEF DESCRIPTION OF THE DRAWINGS

FIG. 1(a)-FIG. 1(c) illustrate a DRAM of a layered-type memory cell structure, as an embodiment of the present invention;

FIGS. 2-9 illustrate processes for manufacturing the DRAM of the memory cell structure;

FIGS. 10-15 each illustrate a part of processes for manufacturing a DRAM of another embodiment of the present invention;

FIG. 16-FIG. 21 illustrate a second embodiment of the present invention;

FIGS. 22-25 illustrated a third embodiment of the present invention; and

FIGS. 26-28 illustrate a conventional DRAM of a layered-type memory cell structure.

BEST MODE FOR CARRYING THE INVENTION

Figure 2A:
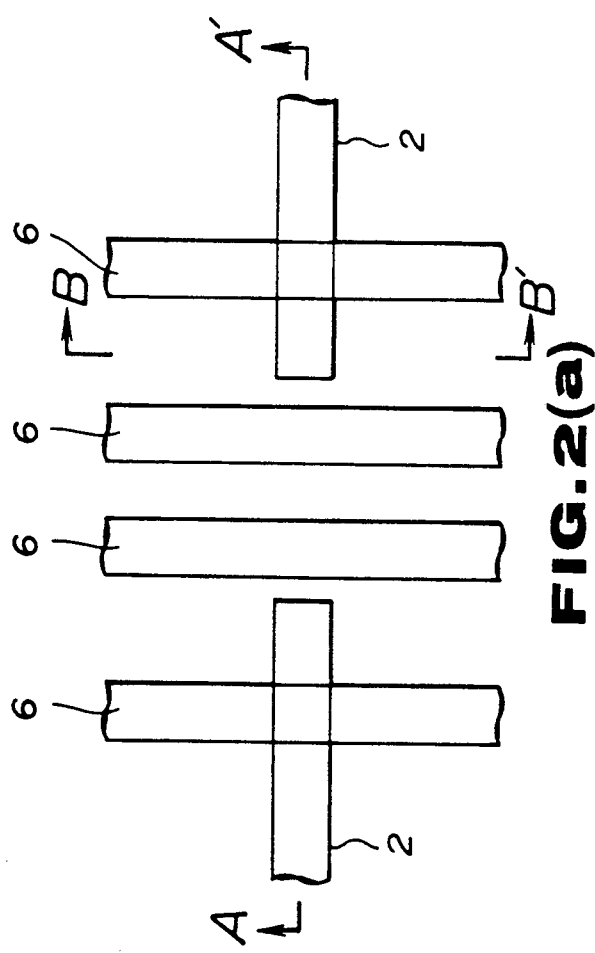

Embodiments of the present invention will now be described in detail with reference to the drawings.

Embodiment 1

FIGS. 1(i a)-(c) are a plan view of two adjacent bit cells of a DRAM of a layered-type memory cell structure as an embodiment of the present invention and arranged in the direction of extension of a bit line. a cross sectional view taken along the line A-A' and a cross section view taken along the line B-B' of FIG. 1(i a), respectively. In the particular embodiment, the capacitor is formed below the bit line.

The DRAM is characterized in that the top and side of a gate electrode 6 of the MOSFET are covered with a (hick insulator film 8 and that the bit line contact and the storage node contact are formed very close to, or overlapping with, the gate electrode. The other structural portions are similar to those of the DRAM of the conventional layered-type memory cell structure in which a capacitor is formed under the bit line.

A p-type silicon substrate 1 having a resistivity of about 5Ω·cm is divided by a device separating insulator film 2 into two active regions in each of which a MOSFET is formed which includes an n-type diffusion layers 4a and 4b constituting the source and drain regions, respectively, and a gate electrode 6 formed via a gate insulator film 5 between the source and drain regions. A capacitor is formed which includes a storage node electrode 16 formed so as to contact the n-type diffusion layer 4a via a contact formed in the inter-layer insulator film formed on the MOSFET, an upper plate electrode 18 and a capacitor insulator film 17 held between electrodes 16 and 18. A bit line 21 is formed via a bit line contact 20 formed in the inter-layer insulator film 19.

The gate electrode 6 is provided so as to extend continuously in one direction of the memory array to form the word line.

A process for manufacturing the DRAM will now be described with reference to the drawings.

FIGS. 2-9 illustrate the steps for manufacturing the DRAM. The reference characters (i a)-(c) in the respective FIGURES denote a plan view, a cross sectional view taken along the line A-A' and a cross sectional view taken along the line B-B', respectively, of two adjacent bit DRAM structures arranged in the direction of extension of the bit line. Formed on a surface of a P-type silicon substrate 1 having a resistivity of about 5 $\Omega$·cm using regular LOCOS method as shown in FIGS. 2(i a)-(c), are a device separating insulator film 2 and a P-type diffusion layer 3 for a punch through stopper. A gate insulator film 5 of a silicon oxide film of a thickness of about 10 nm is formed using thermal oxidization. A polycrystalline silicon film, a metal film or a polycide film is formed as the gate electrode material on the whole surface of the resulting half-finished product. An insulator film such as a silicon oxide film is deposited on the gate electrode material so as to be about 100-300 nm using CVD, and the gate electrode 6 and the insulator film 7 on the gate are patterned simultaneously using photolithography and anisotropic etching techniques.

As the insulator film 7 on the gate, a silicon nitride film or a composite film of a silicon nitride film and a silicon oxide film may be used. Compared with the silicon oxide film, the silicon nitride film has a stronger etching-proof characteristics in an etching process using dilute hydrogen fluoride solution to be carried out in the formation of the contact and the wiring layer. Therefore, the silicon nitride film prevents more effectively the occurrence of the short-circuit between the gate electrode and the wiring layer above the contact.

Arsenic or phosphorus ions are implanted using the gate electrode 6 as a mask to form source and drain regions 4a and 4b of an n-type diffusion layer to thereby form the MOSFET as a switching transistor. The depth of the diffusion layer should be, for example, about 150 nm. Thereafter, in order to increase the insulator breakdown voltage across the gate insulator film, thermal oxidization may be performed, if necessary. An insulator film comprising a silicon oxide layer or a silicon nitride layer of a thickness of about 100 nm or less is deposited on the entire surface of the resulting half-finished product. The entire surface of the resulting MOSFET is then etched using reactive ion etching (RIE) to leave a side wall insulator film 8 so as to self-adjust to the side of the gate electrode 6. Thereafter, slight oxidization is effected so that the contact region is covered with a thin insulator film 9. Like the insulator film on the gate, by using a silicon nitride film for the side wall insulator film 8, it is possible to further increase the breakdown voltage thereof.

Thereafter, as shown in FIGS. 3(i a)-3(c), a first silicon nitride film 10 of a thickness of about 20 nm, a polycrystalline silicon film 11 of a thickness of about 70 nm and a second silicon nitride film 12 of a thickness of about 10 nm are deposited on the film 9 using CVD and patterned. In that case, the respective films are patterned when required. In the particular embodiment, the second silicon nitride film 12 may be patterned at a selective ratio of 5-15 to the polycrystalline silicon underlying the film 12 by RIE using, for example, $CHF_3$ and $O_2$, and is formed so that the bit line contact region and its ambient polycrystalline silicon film are covered. After such formation of the three layer films, an inter-layer insulator film 13 of an insulator film, for example, of phosphate glass, is formed on the entire the three-layered film structure.

Thereafter, as shown in FIGS. 4(i a)-(c), the inter-layer insulator film 13 is patterned using photolithography and reactive ion etching to form a storage node contact 14. At this time, etching conditions which greatly reduces the etching rate of the polycrystalline silicon film compared to that in the film 13 are selected such that the polycrystalline silicon film 11 acts as an etching stopper to thereby prevent a short-circuit from occurring between the gate electrode 6 and storage node contact 14 even if there is substantially no distance between the node contact 14 and gate electrode 6. Therefore, as the etching conditions, a selective ratio of 5-15 is ensured for the underlying polycrystalline silicon by RIE using $CHF_3$ and $O_2$, for example.

Figure 5A:
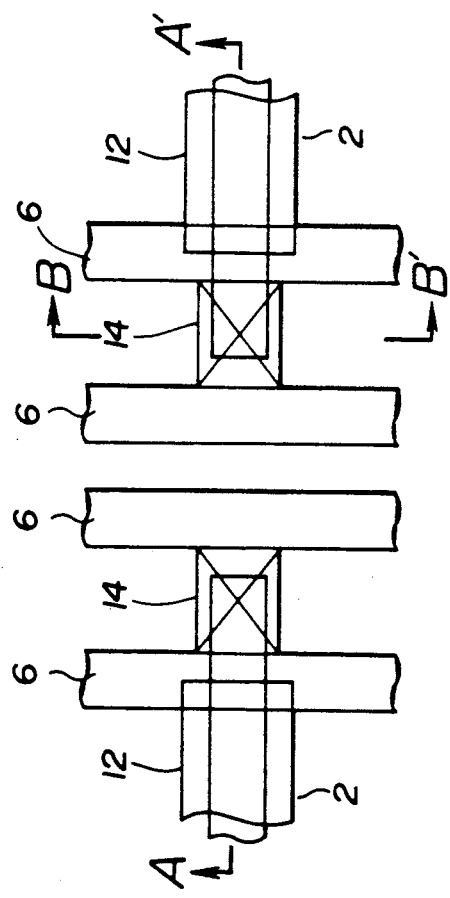
Figure 5C:
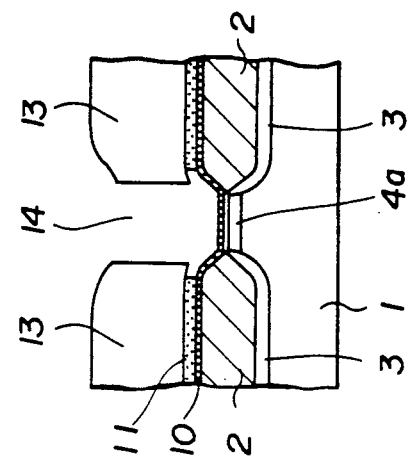
Figure 5B:
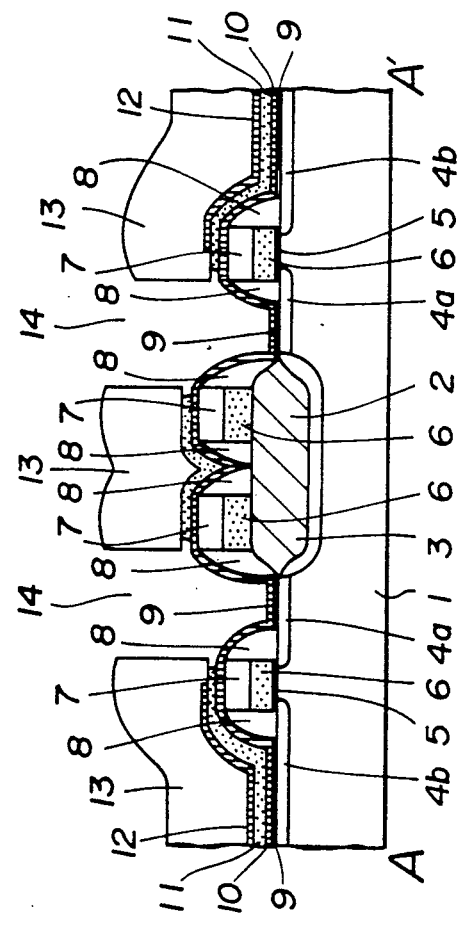

Thereafter, as shown in FIGS. 5(i a)-(c), the polycrystalline silicon film 11 in the storage node contact section 14 is etched away by CDE (chemical dry etching) or isotropic dry etching to expose the underlying silicon nitride film 10. At this time, a selective ratio of 10-20 or more is ensured for the underlying silicon nitride film by isotropic dry etching using $CF_4$ and $O_2$ as the etching conditions.

Figure 6A:
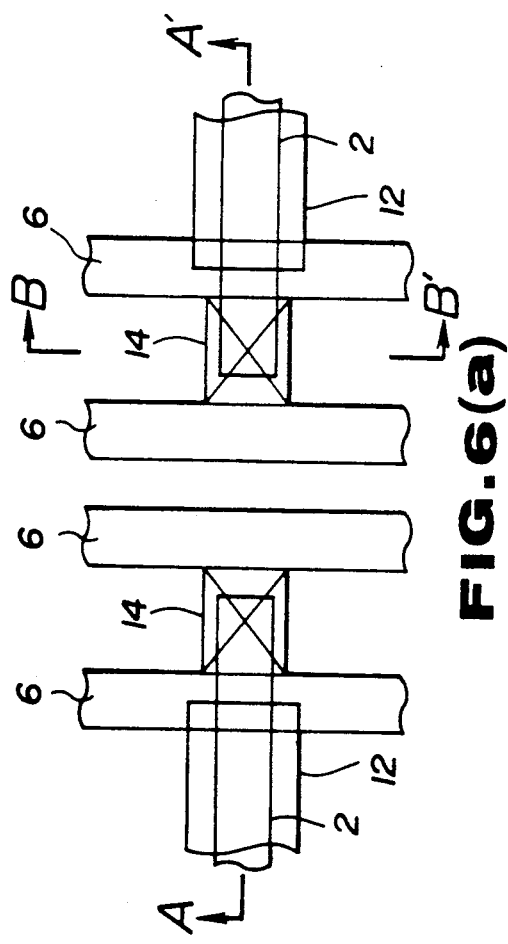
Figure 6B:
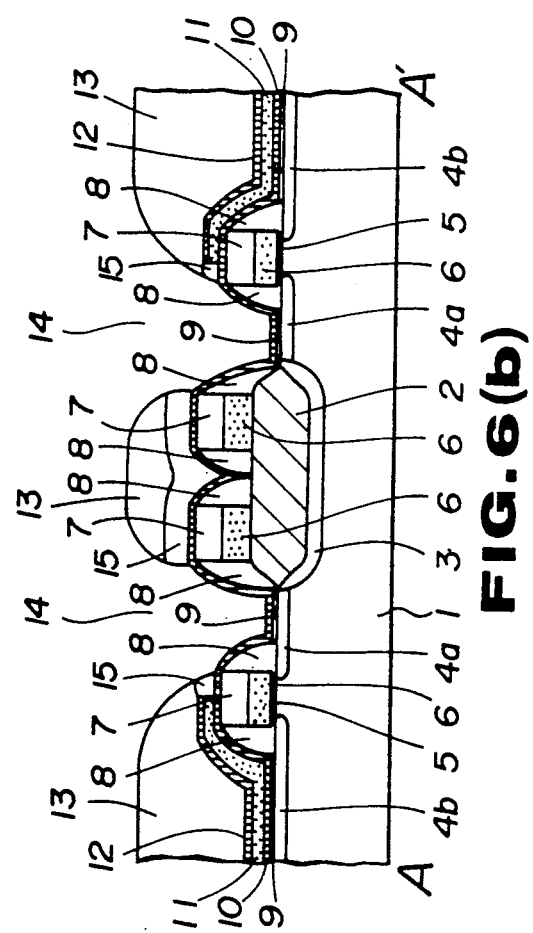
Figure 6C:
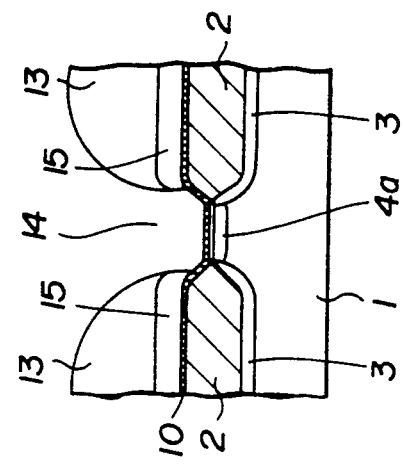

As shown in FIGS. 6(i a)-(c), the polycrystalline silicon film 11 portions exposed on the storage node contact side wall and not covered with the second silicon nitride film 12 are oxidized in a steam atmosphere to form an oxidized silicone film 15. The condition employed at this time should be, for example, heating at 900° C. for about 30 minutes. The phosphate glass is formed on the polycrystalline silicon film and phosphorus, etc., in the glass are doped Into the polycrystalline silicon, so that the oxidizing rate of the polycrystalline silicon increases to thereby oxide the polycrystalline silicon at an oxidizing step at a relatively low temperature for a short time. Since the silicon oxide film 15 intervenes, there is no danger of a short-circuit of leads via the polycrystalline silicon film 11. If an insulator film of a low melting point such as phosphate glass as the inter-layer insulator film is used, the inter-layer insulator film will be melted and flattened at this oxidizing step. During the step of oxidizing the polycrystalline silicon, the storage node contact portion with openings is covered with the oxidization-proof insulator film such as the first silicon nitride film, so that the underlying silicon substrate is not oxidized.

Thereafter, the first silicon nitride film of the storage node contact section and the underlying thin oxide film are removed, for example, using anisotropic etching with $CHF_3$ and $O_2$ as the etching gas to expose the silicon substrate surface. At this time the side and top of the gate electrode are covered with a thick insulator film, and there is no danger of the gate electrode being reached. Alternatively, the gate electrode may be covered with a film having a selective ratio of etching.

After such formation of the storage node contact, a polycrystalline silicon film is deposited on the entire surface of the semi-finished product. Then doping is conducted and the storage node electrode 16 is patterned using photolithography and reactive ion etching. A silicon nitride film is then deposited so as to be about 10 nm thick on the patterned electrode surface using CVD. Thereafter, the resulting semi-finished product is oxidized for about 30 minutes at about 900° C. in a steam atmosphere to form a capacitor insulator film 17 of a two-layer structure of the silicon nitride film and the silicon oxide film. A polycrystalline silicon film is deposited on the upper surface of the insulator film 17, doping is conducted, and the plate electrode 11 is patterned using photolithography and reactive ion etching. Thereafter, unnecessary capacitor insulator film portions are removed using the plate electrode 18 as a mask. An inter-layer insulator film 19 of silicon oxide is deposited on the surface of the resulting semi-finished product. In this way, a capacitor is formed as shown in FIGS. 7(i a)-(c).

Figure 8C:
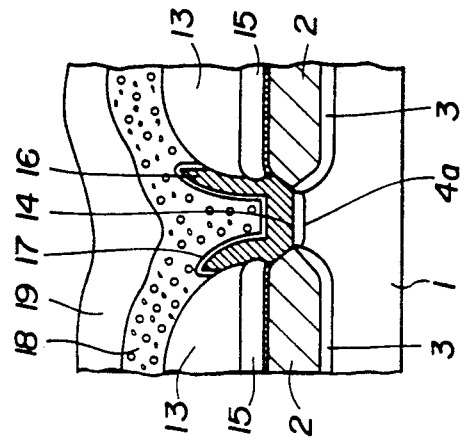
Figure 8A:
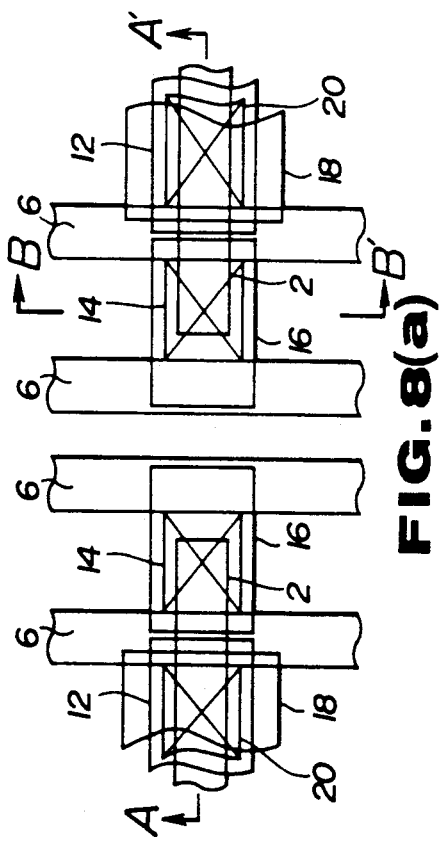
Figure 8B:
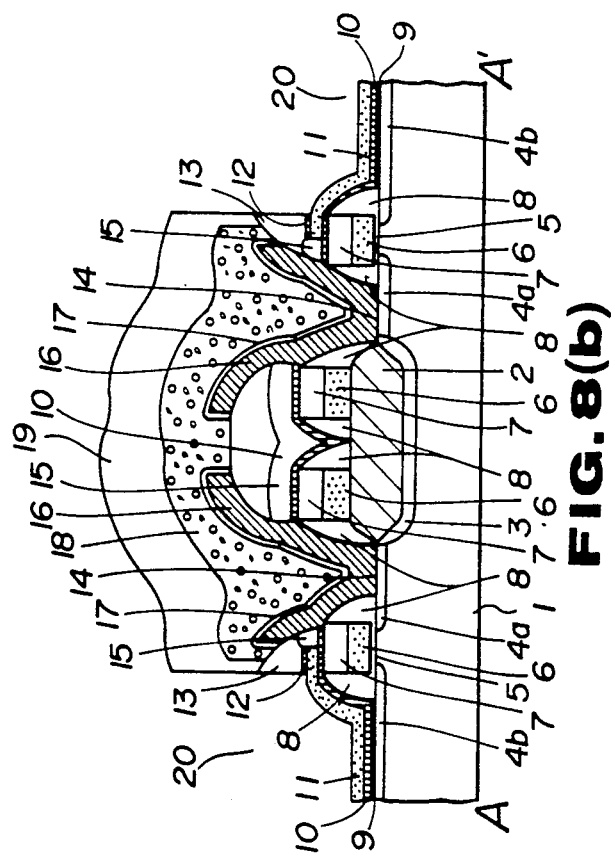

Subsequently, as shown in FIGS. 8(i a)-(c), a bit line contact 20 is formed. First, the inter-layer insulator films 19 and 13 and the silicon nitride film 12 are subjected to anisotropic etching using the polycrystalline silicon film 11 as the etching stopper. A selective ratio of 5-15 or more is obtainable if RIE is used which uses $CHF_3$ and $O_2$, for example, as in the formation of the storage node contact.

Thereafter, as shown in FIGS. 9(i a)-(c), the polycrystalline silicon film 11 exposed in the bit line contact 20 is etched away using CDE, for example.

The resulting semi-finished product is then flattened and subjected to heat treatment to oxidize the remaining polycrystalline silicon film when required, and the silicon nitride film 10 and the thin oxide film 9 are etched away using anisotropic etching, for example. Thereafter, a composite film of a polycrystalline silicon film doped with, for example, arsenic, etc., and a molybdenum silicide film is deposited and patterned using photolithography and reactive ion etching to form a bit line 21.

Thereafter, a silicon oxide film 22 is deposited as a protective film to finish a DRAM such as that shown in FIGS. 1(i a)-(c).

According to this method, since a polycrystalline silicon film which will be an etching stopper is formed at all times during the formation of the storage node contact and bit line contact, it is unnecessary to provide a margin which allows for misalignment with the gate electrode, and the miniaturization and reliability of the resulting devices are improved.

While in the above embodiment, the heating process is illustrated only at the oxidizing step for the polycrystalline silicon, it may be provided when required. If, for example, silicon nitride films are used for the first and second oxidization-proof insulator films, their oxidization-proof abilities will be improved by applying to the films a thermal process, for example, of a nitriding atmosphere or an oxidization process after deposition of those insulator films, and the ability of the first silicon nitride films as the stopper used when the upper polycrystalline silicon film is etched is improved. This thermal process may be performed between the deposition of the first and second oxidization-proof insulator films and the etching of the polycrystalline silicon films.

Alternatively, an inter-layer insulator film, for example, of phosphate glass, may be deposited on the polycrystalline silicon film, melted in a thermal process using an $N_2$ atmosphere at 900° C. and flattened and then the contact forming process may then be performed. Even if phosphate glass is not used as the interlayer insulator film, the flattening may be performed using another flattening method such as etchback.

While in the above embodiment, the insulator film is beforehand deposited on the gate electrode and patterned and the insulator film deposited newly on the entire surface of the resulting product is processed by anisotropic etching such that it is left on the side wall of the ate electrode in order to cover the gate electrode and its side wall in a self-aligning manner, other processes may be used which include oxidization, for example, in a steam atmosphere, after the gate electrode is patterned. In this case, since the gate electrode is densely doped an oxide film thicker than the silicon substrate surface is formed.

While in the above embodiment the source and drain regions are made of only an n-type diffusion layer, high density ions may be implanted after the formation of the side wall insulator film 8 to provide an LDD structure to thereby improve the performance of the resulting transistor.

Figure 10C:
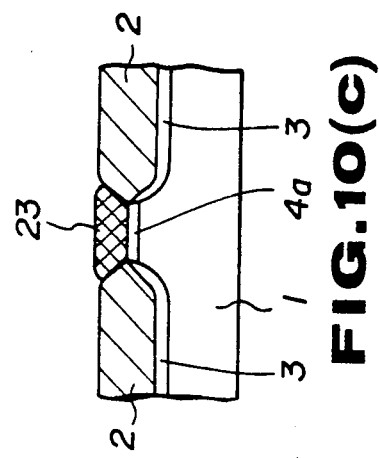
Figure 10A:
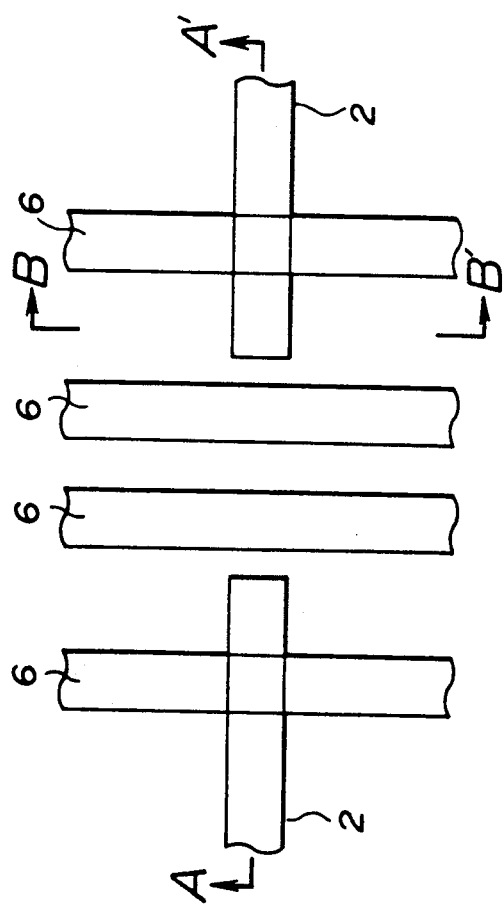
Figure 10B:
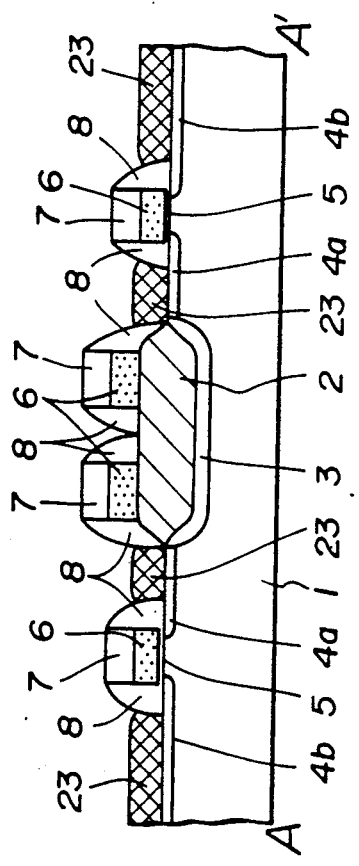

As shown in FIGS. 10(i a)-10(c), after the formation of the side wall insulator film 8, a silicon layer 23 of a thickness of about 200 nm may be formed by selective epitaxial growth (SEG) in the source and drain regions, and high density ions may be then implanted, instead of direct implantation of high density ions into the substrate surface. Thus, as shown in FIGS. 11(i a)-11(c), a short channel effect due to extension of the diffusion length formed by high density impurities is prevented from occurring and reliability is improved.

According to this structure, a step in the gate is reduced and the device regions are expanded as will be obvious from FIG. 11(c), in addition to the above advantages.

As shown in FIGS. 12(i a)-12(c), if a silicon layer 23 is formed using SEG technique after the formation of the bit line contact and the step in the bit line contact is removed, the working accuracy of the bit line is improved. Thus, the contact resistance is reduced and the performance is improved.

The formation of the silicon layer on the bit line contact may be performed before the formation of the capacitor. Alternatively, it may be performed using ion implantation several times when required.

Imbedding of the contact is not necessarily required to be performed in the polycrystalline silicon layer, but may be performed in any of other metals and silicide.

While in FIGS. 3(i a)-3(c) the 3-layer structure of the silicon nitride film 10, polycrystalline silicon film 11 and silicon nitride film 12 have been described as being patterned when required, the polycrystalline silicon film 11 positioned between the gate electrodes 6 on the device separating region 2 may be beforehand patterned and eliminated by photolithography and reactive ion etching as shown by a reference numeral 200 in FIGS. 13(i a)-(c).

This structure is effective for formation of and, especially, for enhancement of the reliability of fine devices. Otherwise, if the distance between the gate electrodes 6 on the device separating region 2 becomes narrower, the space 6 would be filled with a part of the polycrystalline silicon film 11 deposited on the electrodes. If the polycrystalline silicon film 11 is left as it is, the polycrystalline silicon film would become thickened at that portion, so that oxidization would be insufficient in the oxidizing process and polycrystalline silicon would remain as it is in that portion to thereby cause a possible short circuit. Even if oxidization is performed, a very large stress would act on the gate electrode to cause possible crystal defects and gate deformation due to volume expansion by oxidization of the polycrystalline silicon film imbedded in the space region. This problem can be eliminated by removal of the portion of the polycrystalline silicon layer film 11 on the area between the gate electrodes 6 on the device separating area 2, as mentioned above.

This applies to any patterns in which the distance between the gate electrodes is small.

In the formation of the bit line contact in FIGS. 8(i a)–8(c), the distance between the bit line contact and the plate electrode 18 tends to decrease together with the fining of the devices, so that there is a danger of a short circuit occurring between the bit line contact and the plate electrode 18. In order to avoid such problem, a side wall insulator film may be provided on the side wall of the contact after the formation of an opening in the bit line contact.

Figure 18A:
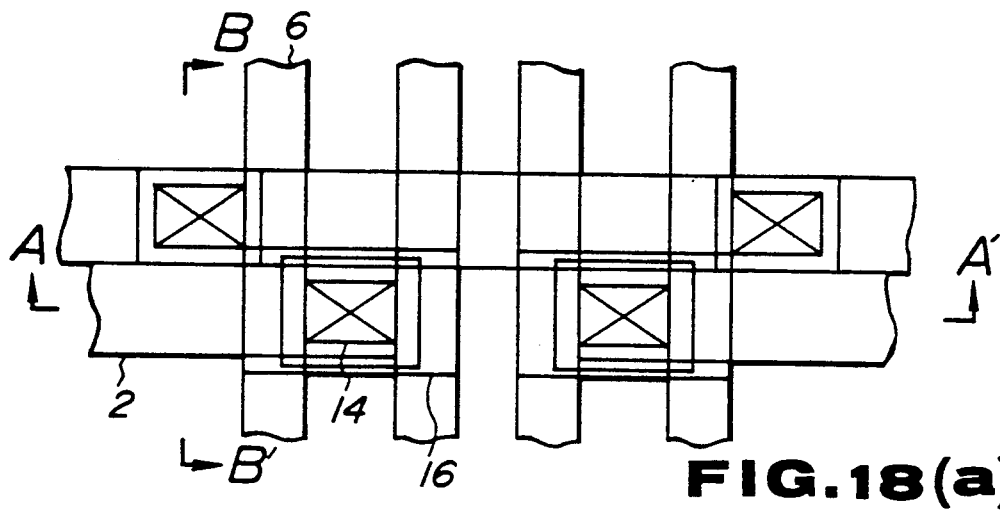
Figure 18B:
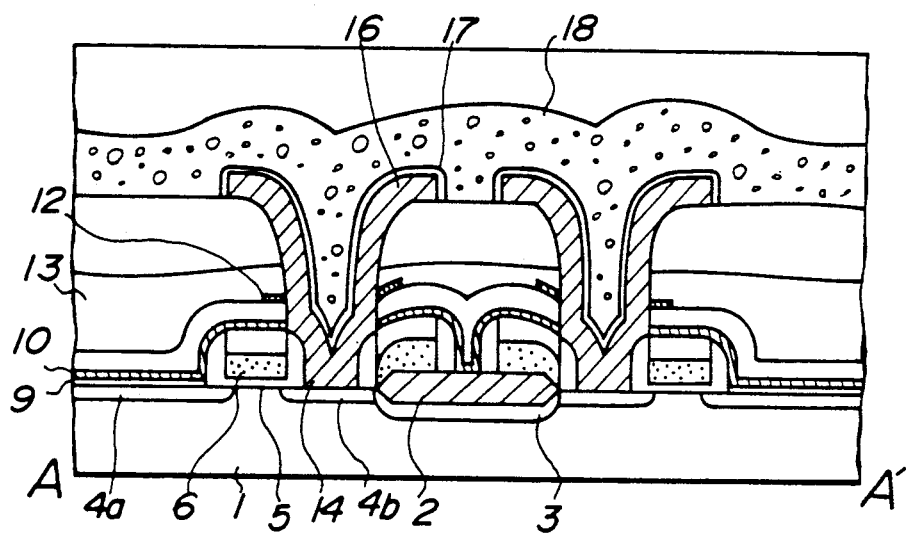
Figure 18C:
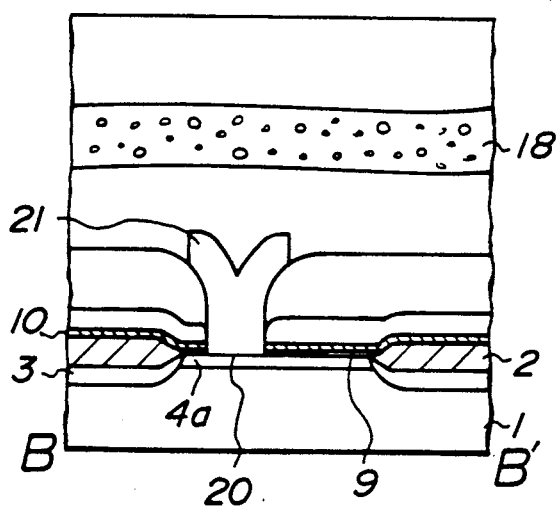

In order to prevent the occurrence of a short circuit between the bit line contact and the plate electrode 18, the pattern of the plate electrode 18 may be formed beforehand so as to project toward the bit line contacts such that parts of the bit line contact overlaps the plate electrodes 18, as shown in FIG. 14. The polycrystalline silicon 11 used as the stopper may be etched while the plate electrodes 18 protruding into the contacts is being etched away, as shown in FIG. 15, and oxidization may be performed as shown in FIG. 16. Thus, the surface of the polycrystalline silicon of the plate electrode on the bit line contact side wall is oxidized to be a silicon oxide film 15', as shown in FIGS. 18(i a)–18(c), so that a short circuit between the bit line contact and the plate electrode 18 is avoided.

Also, in this case, a silicon oxide film or a silicon nitride film may be deposited on the entire surface of the half-finished product, for example, using CVD instead of the formation of the silicon oxide film by surface oxidization, and the side wall insulator film may be formed in a side wall leaving process using anisotropic etching. Alternatively, a combination of the oxidization and the side wall leaving process may be used.

Alternatively, a further method may be used in which the polycrystalline silicon film of the plate electrode 18 may be left on the entire bit line contact. In the etching of the inter-layer insulator film 19 it is temporarily stopped by the polycrystalline silicon film; subsequently, the polycrystalline silicon film 17 is etched; the inter-layer insulator film 13 is etched up to the polycrystalline silicon film 11, which is then etched; oxidization is conducted to oxidize the polycrystalline silicon film as the stopper on the side, and the silicon nitride film 10 and the thin silicon oxide film 9 are etched to form the contact.

Also in this case, a method may be conducted in which after the polycrystalline silicon film 11 is etched and oxided, an insulator film such as a silicon oxide film or a silicon nitride film is newly deposited, an insulator film is left slightly overetched on the side wall using anisotropic etching, and the silicon nitride film 10 and thin silicon oxide film are etched.

In the formation of the 3-layered film shown in FIGS. 3(i a)–3(c), the silicon nitride film 10 and the thin silicon oxide film 9 of the bit line contact may be patterned using lithography and reactive ion etching, as shown in FIGS. 17(i a) to 17(c). The etching conditions at this time may be similar to those used in the first embodiment. If necessary, arsenic ions, etc., may be implanted into the polycrystalline silicon film.

This causes the polycrystalline silicon film 11 in the bit line contact to be not required to be etched away when the bit line contact is formed because the silicon film 11 is electrically conductive to the source and drain regions in the substrate by such process. This also reduces a step in the contact advantageously. After the formation of the contact, the polycrystalline silicon film 11 may be doped.

While in the particular embodiment the silicon nitride film is formed directly as the second oxidization-proof insulator film on the polycrystalline silicon film, the underlying polycrystalline silicon film is required in this case to have a selective ratio as the etching conditions for patterning the oxidization-proof insulator film. For etching purposes, anisotropic etching using $CHF_3$ and $O_2$ may have to be used in this case. Therefore, if a step in the surface is high, etching would be insufficient at the step. Thus, the silicon nitride film may be formed through the silicon oxide film formed by oxidizing the surface of the polycrystalline silicon film. By doing so, isotropic etching such as chemical dry etching using $CF_4$ and $O_2$ having a selective ratio of 5–15 or more may be employed for the oxide film underlying the oxidization-proof insulator film in the etching of the oxidization-proof insulator film, so that there is no probability of insufficient etching where a step in the surface is high. When isotropic etching is used, it is difficult to form conditions under which the etching selective ratios of the silicon nitride film and the polycrystalline silicon film greatly differ, but it is easy form conditions under which the etching selective ratios of the silicon nitride film and the silicon oxide film greatly differ. If the thus exposed silicon oxide film on the polycrystalline silicon is required to be etched after the second silicon nitride film is patterned using isotropic etching with the silicon oxide film used as the stopper, it may be etched using wet etching, for example, with $NH_4F$, so that the oxide silicon film is easily etched away without etching the underlying polycrystalline silicon film.

One reason for carrying out the etching to the silicon oxide film on the polycrystalline silicon is that the polycrystalline silicon and the phosphate glass become in contact with each other by the etching so that phosphorus, etc. in the phosphate glass diffuses into the polycrystalline silicon. Thus, the polycrystalline silicon is securely oxidized during the formation of the storage node contact.

If the silicon oxide film is not required to be eliminated, an inter-layer insulator film such as phosphate glass may be formed on the silicon oxide film as it is. In this case, since the polycrystalline silicon and the phosphate glass are not in contact with each other, the polycrystalline silicon is always in a non-doped state. Therefore, the etching selection ratio is always constant, and a big etching selection ratio is obtainable during the RIE process for etching the inter-layer insulator film in forming the contact. (Generally, when doped, the etching rate becomes fast and the etching selection ratio becomes decreased.)

While in the particular embodiment the oxidization-proof insulator film is shown as being formed with the contact forming region being covered with a thin silicon oxide film, it is intended to relax stress, so that it may be replaced with another insulator film or otherwise omitted when required.

In addition, while in the particular embodiment the layered-type memory cell structure where the capacitor is formed below the hit line has been described, that concept may be applicable to a layered-type memory cell structure, where the capacitor is formed above the bit line.

Embodiment 2

FIGS. 18(i a)-18(c) are a plan view of two adjacent bit cells of a DRAM having a layered-type memory cell structure as a second embodiment of the present invention and arranged along the bit line of the DRAM, and a cross sectional view taken along the line A-A' of FIG. 18(i a) and a cross view taken along the line B-B' of FIG. 18(i a), respectively. In the particular embodiment, the capacitor is formed on the bit line.

The DRAM is characterized in that the upper and side surfaces of the gate electrode 6 of a MOSFET are covered with a thick insulator film 8, and that the bit line contact and storage node contact are formed very close to, or overlapped with, the gate electrode. The remaining structural portions of the DRAM are similar to those in a DRAM having the conventional layered-type memory cell structure in which the capacitor is formed above the bit line.

Figure 19A:
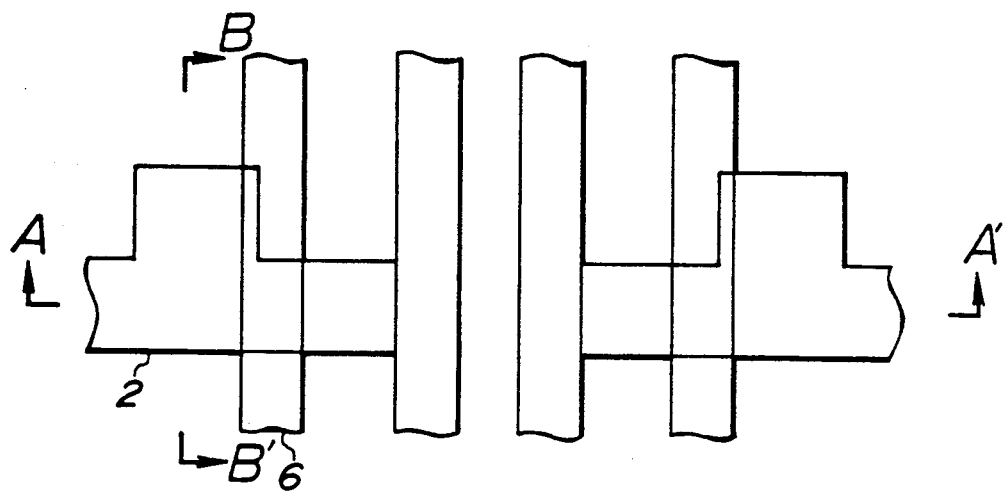
Figure 19B:
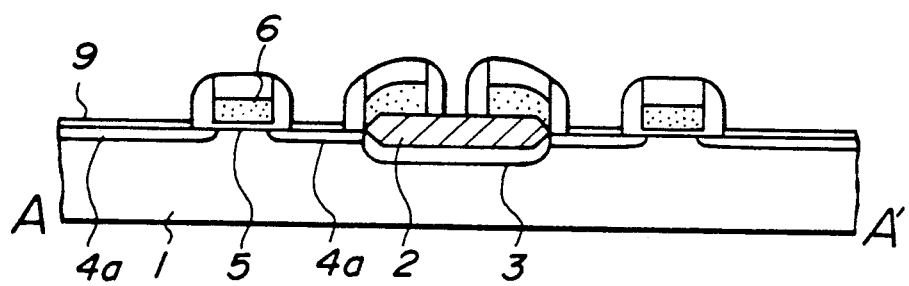
Figure 19C:
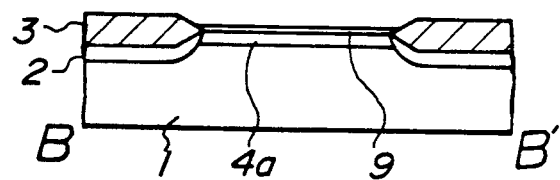
Figure 20A:
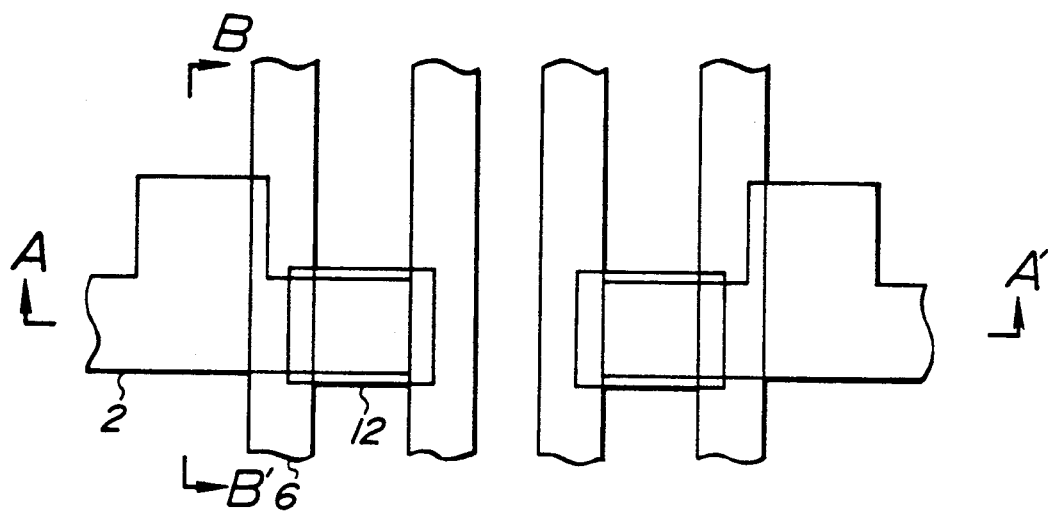
Figure 20B:
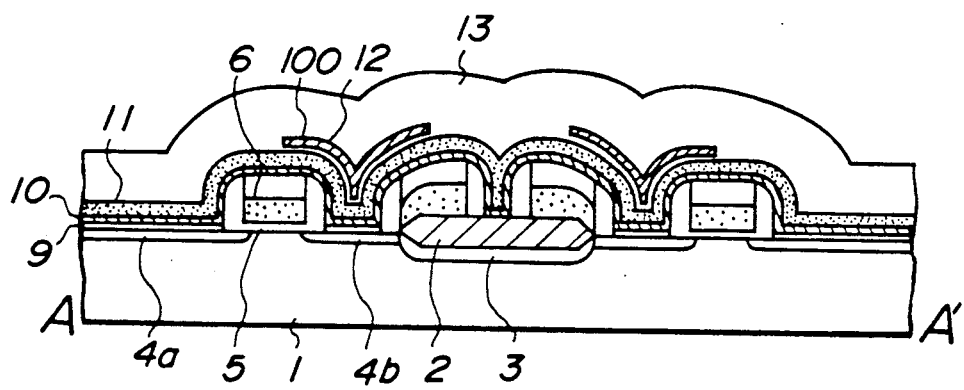
Figure 20C:
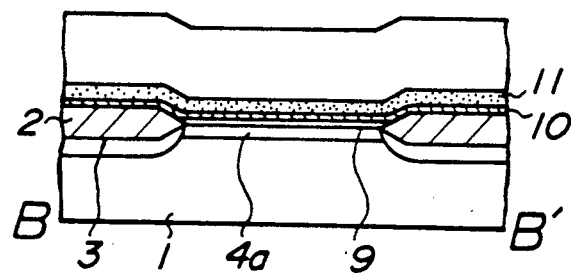
Figure 21A:
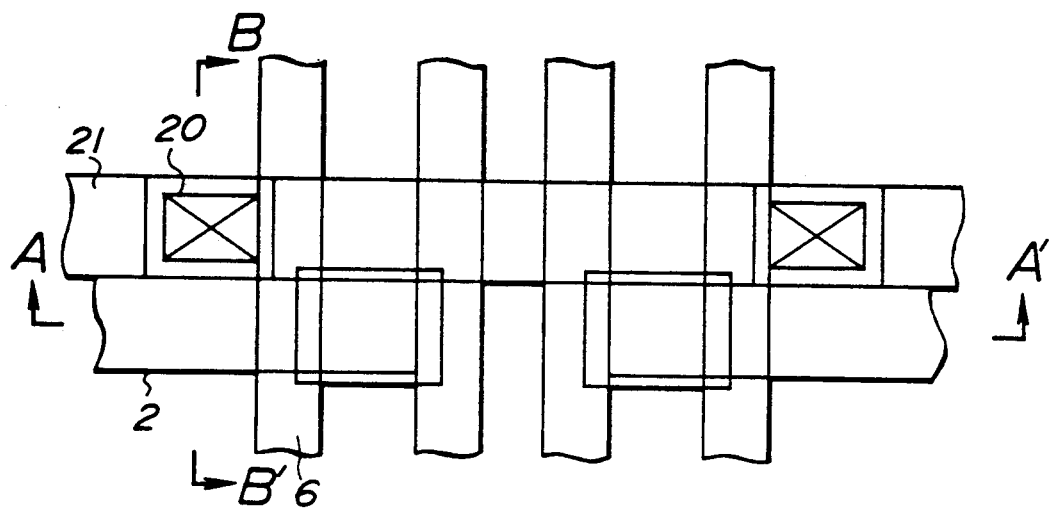
Figure 21B:
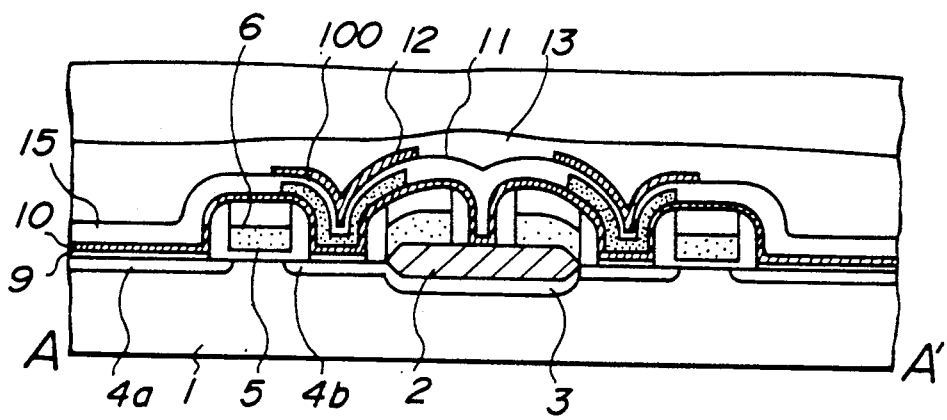
Figure 21C:
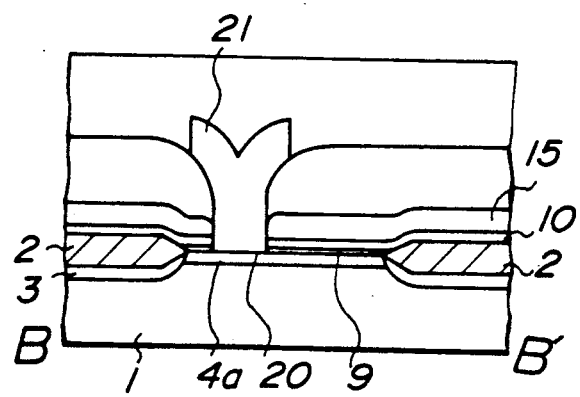

A method of manufacturing the inventive DRAM will be described with reference to the drawings. FIGS. 19-21 illustrate the steps of the DRAM manufacturing method. In each of FIGS. 19-21, reference characters (i a)-(c) denote a plan view of two adjacent bit cells of the DRAM arranged along the bit line, a cross sectional view taken along the line A-A' of the FIGURE involving the plan view, and a cross sectional view taken along the line B-B' of that FIGURE.

Figure 2B:
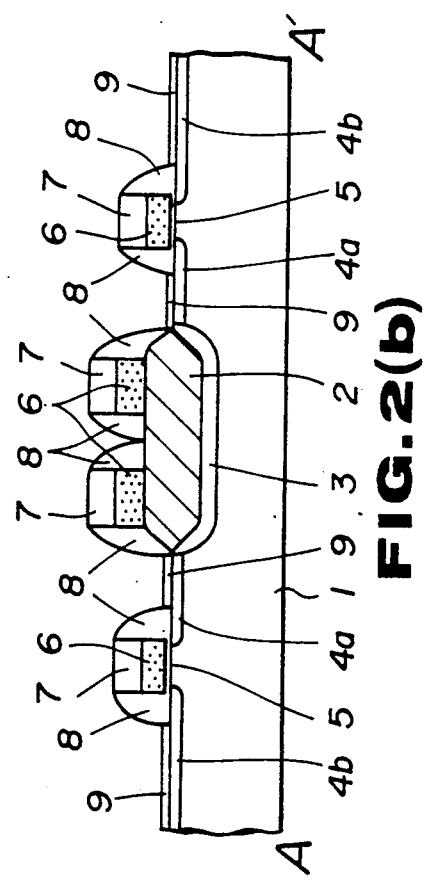
Figure 2C:
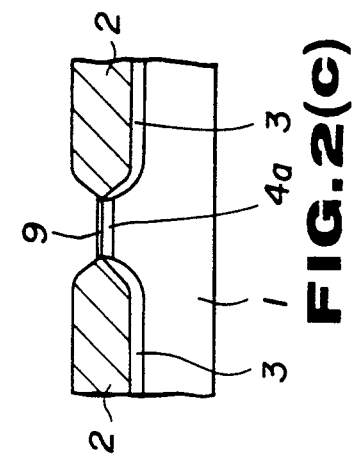

As in FIGS. 2(a)-(c) for the first embodiment, a device separating insulator film 2 and a p-type diffusion layer 3 for a punch-through stopper are formed on the surface of a p-type silicon substrate 1, and the gate insulator film 5, gate electrode 6 and insulator film 7 on the gate are patterned simultaneously.

Ions are then implanted into the resulting surface of the half-finished product using the gate electrode 6 as the mask to form source and drain areas 4a and 4b to thereby form a MOSFET as a switching transistor.

An insulator film of silicon oxide or silicon nitride is deposited on the overall surface of the MOSFET using CVD. Reactive ion etching is conducted then to etch the resulting overall insulator film surface to leave a side insulator film 8 on the side of the gate electrode 6 in a self-aligning manner. Thereafter, slight oxidization is conducted so as to cover the contact area with a thin insulator film 9 (FIGS. 19(i a)-19(c)).

Thereafter, as in the first embodiment shown in FIG. 3, a first silicon nitride film 10, a polycrystalline silicon film 11, a second silicon nitride film 12 and an inter-layer insulator film 13 including phosphate glass are formed on the insulator film 9. While in the first embodiment the second silicon nitride film 12 was formed on the bit line contact side, a bit line contact such as 20 is first formed and storage node contact such as 14 is then formed in the particular embodiment, so that the second silicon nitride film 12 is formed on the later formed side (FIGS. 20(i a)-20(c)). In the particular embodiment, slight oxidization is conducted after the polycrystalline silicon film is formed to form a thin silicon oxide film 100 on the polycrystalline silicon film 11 and then to form a second silicon nitride film 12.

As mentioned above, the patterning of the second silicon nitride film 12 may be performed by isotropic dry etching using the underlying silicon oxide film as the stopper. After the patterning of the second silicon nitride film 12, the silicon oxide film 100 may be left as it is whereas in the particular embodiment the film 100 is then etched, for example, with $NH_4F$ solution to eliminate the silicon oxide film 100 on the exposed area.

Thereafter, a bit line contact is formed by a method similar to that used to form the storage node contact 14 in the first embodiment, to form a bit line 21 and to form the inter-layer insulator film 13.

Subsequently, the inter-layer insulator film 13 is patterned to form the storage node contact 14 and then a capacitor to complete the DRAM shown in FIGS. 18(i a)-18(c).

Embodiment 3

While in the above embodiment the DRAM having the layered-type memory cell structure has been described, this method is effective for the formation of a device including the step of forming a plurality of contacts without being limited to DRAMs having a layered-type memory cell structure.

In the particular embodiment, three kinds of contacts A, B and C are formed in the source, drain and gate areas, respectively. For the contact C, the method of forming a contact according to the present invention including the step of stopping the etching temporarily at the polycrystalline silicon layer is not used.

The pattern of the second silicon nitride film varies depending on the sequence of forming the contacts A, B and C.

First, the formation of the contact A in the source area will be described (FIGS. 22(i a)-22(c)). In this case, the second silicon nitride film 12 is formed beforehand in an area where the contact B is to be formed later by using polycrystalline silicon as a stopper.

A lead a is formed as in the formation of the storage node contact in the first embodiment. Contact B is formed to form a lead b, and contact C is then formed to form a lead c. The sequence of forming contact B and C may be reversed.

For the contact B where the second silicon nitride film 12 is formed, the inter-layer insulator film is patterned using the polycrystalline silicon film 11 as the etching stopper and oxidized later into the silicon oxide film 15 as in the formation of the bit line contact in the first embodiment. For the contact C, it is formed in the gate electrode directly as in the formation of a regular contact.

The first formation of contact C in the gate area will now be described (FIGS. 23(i a)-23(c)). In this case, the contact C may be formed after the polycrystalline silicon underlying the contact C is oxidized.

If the second silicon nitride film 12 is formed beforehand in the area where contacts A and B are to be formed to thereby prevent the polycrystalline silicon film from disappearing, the contact A and B will be formed as in the formation of the bit line contact in the first embodiment. In the present embodiment, the contact A and B are formed simultaneously.

Figure 24A:
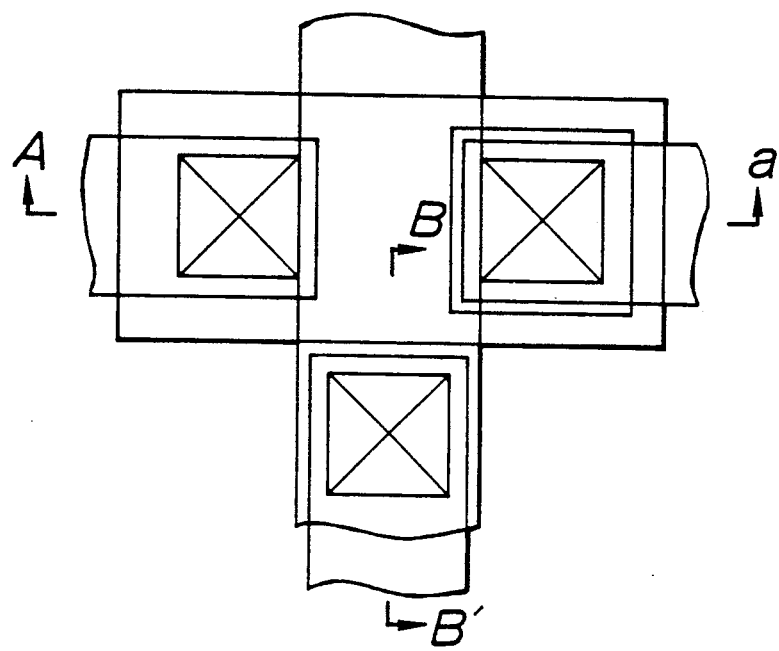
Figure 24B:
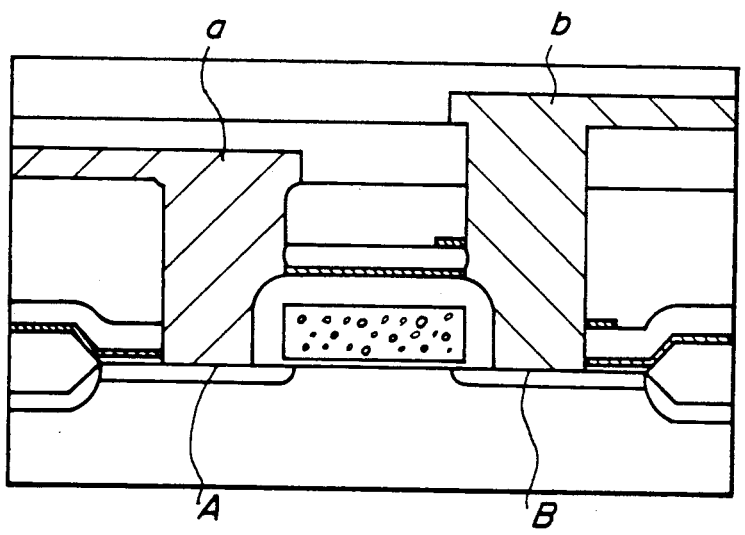
Figure 24C:
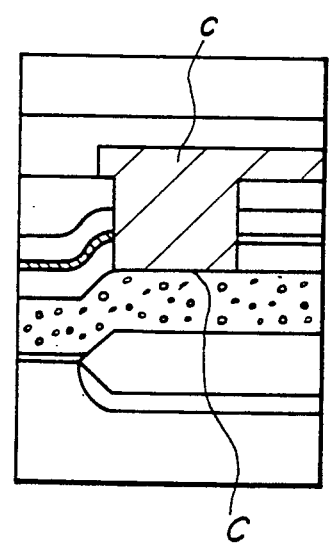
Figure 28A:
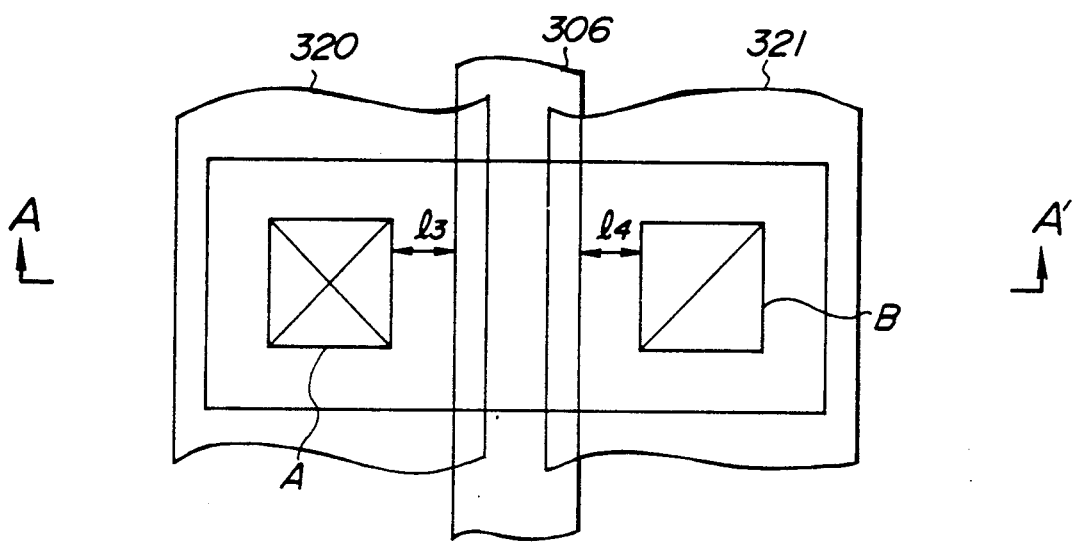
Figure 28B:
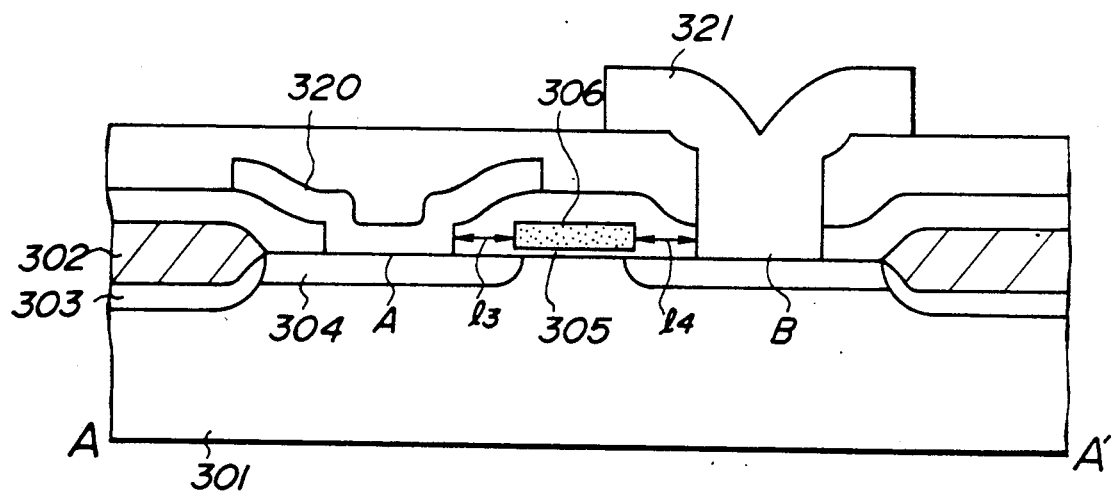

FIG. 24 illustrates the formation of contact B after the formation of contact A and C as the contacts for the same lead. In this case, it is desirable to form the second silicon nitride film on the side of the contact B to be formed layer. For the contacts A and B, the contact A is opened as in the formation of the storage node contact in the first embodiment, and the contact C is then formed as in the formation of a regular contact using lithography and etching techniques.

As just described above, the two contacts are formed in the two steps using separate masks and leads are then formed.

As described above, the contacts may be formed separately even if a regular contact C is included. The polycrystalline silicon at the contact C may be removed by patterning directly after the polycrystalline silicon is deposited.

As shown in FIG. 25, the second silicon nitride film 12 may be used in common to the contacts A and B. In this case, the polycrystalline silicon film would remain between the contacts A and B, but there is no possibility of a short circuit via the polycrystalline silicon film 12 since the polycrystalline silicon film is changed to an oxide film on the side of the contacts A and B.

As just described above, it is not necessarily required to pattern the silicon nitride film 12 for each contact. As described above, according to the inventive semiconductor memory formation, the gate electrode of the MOSFET is covered with the thick insulator film, the lower and upper contact forming regions are covered with the thin insulator films, and at least the upper surface of the gate electrode is covered with the first oxidization-proof insulator film. The polycrystalline silicon film is formed, and at least part of the polycrystalline silicon film is then covered with the second oxidization-proof insulator film. Under such condition, the inter-layer insulator film is then formed, the underlying contact hole is formed in the inter-layer insulator film with the polycrystalline silicon film being used as the etching stopper, the polycrystalline silicon film in the contact is removed, and the oxidization process is effected such that the polycrystalline silicon film in the area not covered with the second oxidization-proof insulator film is oxidized. In this oxidization, the polycrystalline silicon film left without being subjected to oxidization because the second oxidization-proof insulator film is formed on the polycrystalline silicon film also acts as the stopper in the next contact forming process and can act as the oxide film later formed by oxidization. Therefore, this structure is effective in the formation of the contact in the subsequent process to thereby provide a miniaturized semiconductor device with improved reliability.

What is claimed is:

1. A process for manufacturing a semiconductor device of a layered capacitor structure including:
   a cell including a MOSFET and a capacitor in a substrate;
   the capacitor formed on an insulator film covering the surface of the substrate on which the MOSFET is formed such that a storage node electrode of the capacitor contacts a source or drain region of the MOSFET via a storage node contact open in the insulating film, comprising the steps of:
   forming the MOSFET in the semiconductor substrate;
   covering the top and side of a gate electrode of the MOSFET with an insulator film;
   forming a first oxidization-proof insulator film in a region of the storage node contact, a bit line contact region or both such that at least part of the gate electrode is covered;
   forming a polycrystalline silicon film on the first oxidization-proof insulator film;
   forming a second oxidization-proof insulator film on at least part of the polycrystalline silicon film;
   forming a first inter-layer insulator film on the second oxidization-proof insulator film;
   removing part of the first inter-layer insulator film to expose the polycrystalline silicon film;
   etching the polycrystalline silicon film to expose the first oxidization-proof insulator film;
   oxidizing the polycrystalline silicon film to change the polycrystalline silicon film in the area not covered with the second oxidization-proof film to a silicon oxide film;
   removing the first oxidization-proof insulator film to form the storage node contact or bit line contact;
   forming a desired lead or device so as to contact a first contact and forming a second inter-layer insulator film; and
   forming a second contact on the second inter-layer insulator film, using as an etching stopper the polycrystalline silicon film covered by the second oxidization-proof insulator film and remaining without being oxidized.

2. A process according to claim 1, including a step of eliminating the first oxidization-proof insulator film in the first contact forming region after the formation of the first oxidization-proof insulator film and before the formation of the polycrystalline silicon film.

3. A process according to claim 1, wherein the first contact forming step includes a bit line forming step; and wherein the second contact forming step includes a storage node contact forming step.

4. A process according to claim 1, comprising the steps of:
   exposing the source and drain regions by etching; and
   growing a silicon film in the source and drain regions using selective epitaxial growth, after the gate electrode is covered and before the first oxidization-proof insulator film is formed.

5. A process according to claim 1, wherein first contact forming step includes a storage node contact forming step;
   wherein the second contact forming step includes a bit line contact forming step; and
   wherein the process further comprises the steps of:
   etching part of the plate electrode when the polycrystalline silicon film exposed in the bit line contact is etched with the capacitor plate electrode being formed so as to project to overlap part of the bit line contact; and
   oxidizing the polycrystalline silicon film exposed in the bit line contact and an end of the plate electrode.

6. A process according to claim 1, wherein the second contact forming step includes a step of forming a contact to which another device connects.

7. A process according to claim 1, wherein the first oxidization-proof insulator film forming step includes a silicon nitride film forming step.

8. A process according to claim 1, wherein the second oxidization-proof insulator film forming step includes a silicon nitride film forming step.

9. A process according to claim 1, wherein the second oxidization-proof insulator film forming step includes the steps of forming a silicon oxide film and a silicon nitride film; and
   wherein the second contact forming step includes an isotropic etching step.

10. A process according to claim 1, wherein the gate electrode covering step includes:
    forming an upper insulator film by depositing an insulator film on the gate electrode and patterning the insulator film; and
    forming a side wall insulator film by depositing an insulator film on the entire surface of the upper insulator film, leaving the insulator film only on a side wall of the gate electrode using anisotropic etching to form a side wall insulator film in a self-aligning manner.

11. A process according to claim 1, wherein the gate electrode covering step comprises steps of:
heating the gate electrode in a steam atmosphere to oxidize the surface of the gate electrode after the gate electrode is formed.

12. A process according to claim 1, wherein the first inter-layer insulator film is made of phosphate glass.

13. A method of manufacturing a semiconductor device comprising the steps of:
forming a desired device area in a semiconductor substrate;
forming a first electrode;
covering the upper surface and side of the first electrode with an insulator film;
forming a first oxidization-proof insulator film in a contact forming area so as to cover at least part of the first electrode;
forming a polycrystalline silicon film on the first oxidization-proof insulator film;
forming a second oxidization-proof insulator film on at least part of the polycrystalline silicon film;
forming a first inter-layer insulator film on the second oxidization-proof insulator film;
exposing the polycrystalline silicon film by removing part of the first inter-layer insulator film;
etching the polycrystalline silicon film to expose the first oxidization-proof insulator film;
oxidizing the polycrystalline silicon film to change the polycrystalline silicon film in the area not covered with the second oxidization-proof film to a silicon oxide film;
forming a first contact by removing the first oxidization-proof insulator film;
forming a desired lead or device so as to connect with the first contact and then forming a second inter-layer insulator film; and
forming a second contact in the second inter-layer insulator film, using as an etching stopper the polycrystalline silicon film remaining covered with the second oxidization-proof film and free from oxidization.

14. A method according to claim 13, further including the step of forming a third contact in the insulator film formed through no polycrystalline silicon film either before or after the step of forming the first or second contact.

* * * * *